(12) United States Patent
Yokozawa et al.

(10) Patent No.: US 8,349,997 B2
(45) Date of Patent: Jan. 8, 2013

(54) METHOD FOR PRODUCTION OF BLOCK COPOLYMER

(75) Inventors: Tsutomu Yokozawa, Yokohama (JP); Hideyuki Higashimura, Tsukuba (JP); Tomohisa Temma, Shibukawa (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 604 days.

(21) Appl. No.: 12/526,747

(22) PCT Filed: Feb. 14, 2008

(86) PCT No.: PCT/JP2008/052395
§ 371 (c)(1),
(2), (4) Date: Nov. 11, 2009

(87) PCT Pub. No.: WO2008/099864
PCT Pub. Date: Aug. 21, 2008

(65) Prior Publication Data
US 2010/0099823 A1    Apr. 22, 2010

(30) Foreign Application Priority Data
Feb. 14, 2007    (JP) .................................. 2007-033105

(51) Int. Cl.
*C08G 75/00* (2006.01)
(52) U.S. Cl. ........ 528/377; 528/380; 528/373; 525/206; 525/211; 525/203
(58) Field of Classification Search .................. 528/377, 528/380, 373
See application file for complete search history.

(56) References Cited

U.S. PATENT DOCUMENTS

| 2003/0045642 A1 | 3/2003 | Wu et al. |
| 2006/0229427 A1 | 10/2006 | Becker et al. |
| 2006/0278867 A1 | 12/2006 | McCullough et al. |

FOREIGN PATENT DOCUMENTS

| GB | 2448098 A | 10/2008 |
| JP | 2005-075913 A | 3/2005 |
| JP | 2005-515264 A | 5/2005 |
| JP | 2005-206826 A | 8/2005 |
| JP | 2006-225461 A | 8/2006 |
| JP | 2007-119709 A | 5/2007 |
| JP | 2007-211237 A | 8/2007 |
| JP | 2007-246887 A | 9/2007 |
| WO | 2005/014688 A2 | 2/2005 |
| WO | 2006/088217 A1 | 8/2006 |
| WO | 2007/074920 A1 | 7/2007 |

OTHER PUBLICATIONS

Leni Akcelrud, "Electroluminescent polymers," Prog. Polym. Sci., 2003, pp. 875-962, vol. 28.
Akihiro Yokoyama, et al., "Chain-Growth Polymerization for Poly(3-hexylthiophene) with a Defined Molecular Weight and a Low Polydispersity," Macromolecules, 2004, pp. 1169-1171, vol. 37.
Ryo Miyakoshi, et al., "Catalyst-Transfer Polycondensation for the Synthesis of Poly(p-phenylene) with Controlled Molecular Weight and Low Polydispersity," J. Am. Chem. Soc., 2006, pp. 16012-16013, vol. 128.
Takashi Konishi, et al., "Effect of Isotacticity on Formation of Mesomorphic Phase of Isotactic Polypropylene," Macromolecules, 2005, pp. 8749-8754, vol. 38.
T. Yokozawa et al., "Catalyst-Transfer Condensation polymerization for the Synthesis of Well-Defined Polythiophene with Hydrophilic Side Chain and of Diblock Copolythiophene with Hydrophilic and Hydrophobic Side Chains", High Performance Polymers, vol. 19, 2007, pp. 684-699.
European Patent Office, "Communication Pursuant to Article 94(3) EPC," issued in connection with European Patent Application No. 08 711 237.1, dated Jun. 29, 2012.
Ulrike Wenzel: "Charakterisierung eines ultrahochmolekularen Polymethacrylats mit flussigkristalliner Seitengruppe in verdunnter Losung", Dissertation, vol. D83/2000 Jul. 5, 2000, p. 78pp, XP007912815, Retrieved from the Internet: URL:http://opus.kobv.de/tuberlin/volltexte/2000/171/pdf/wenzel ulrike.pdf [retrieved on Apr. 26, 2010].

*Primary Examiner* — Shane Fang
(74) *Attorney, Agent, or Firm* — Sughrue Mion, PLLC

(57) ABSTRACT

Disclosed is a method for producing a block copolymer which comprises two or more blocks composed of aromatic units having different basic structures from each other and has a high molecular weight, a narrow chain length distribution and a narrow molecular weight distribution. Also disclosed is a block copolymer produced by the method. The method for producing a block copolymer comprises the step of sequentially reacting two or more aromatic compounds which are selected from aromatic compounds represented by a specific general formula and are different in the group Ar, in the presence of a nickel complex containing a phosphine compound represented by a specific general formula or a palladium complex containing a phosphine compound represented by a specific general formula to thereby form blocks comprising the aromatic compounds sequentially, wherein the two or more aromatic compounds are reacted in descending order of parameter of aromatic ring charge.

1 Claim, No Drawings

METHOD FOR PRODUCTION OF BLOCK COPOLYMER

TECHNICAL FIELD

The present invention relates to a method for producing a block copolymer

BACKGROUND ART

It is known that aromatic polymers have excellent characteristics in electrical characteristics, optical characteristics, heat resistance, mechanical characteristics, and the like, and hence are useful as advanced functional materials such as conductive materials, photoelectric transfer materials, luminescent materials, nonlinear optical materials, battery materials, electronic part materials and automobile materials. Among them, intensive researches have been conducted on EL materials, and there are known polymeric compounds such as polythiophene, polyfluorene, and polyparaphenylene derivatives (Non-Patent Document 1).

Recently, Yokozawa et al have reported a method for producing an aromatic polymer by polycondensation of an aromatic compound having two reactive substituents in the presence of an Ni catalyst or a Pd catalyst (Non-Patent Documents 2 and 3, and Patent Document 1).

On the other hand, Non-Patent Document 4 discloses a method for producing a block copolymer having two kinds of blocks comprising thiophene units by polycondensation of two aromatic compounds having thiophene as basic structure and differing in only substituents in the presence of an Ni catalyst.

Non-Patent Document 1: Progress in Polymer Science, 2003, 28, 875
Non-Patent Document 2: Macromolecules, 2004, 37, 1169
Non-Patent Document 3: J. Am. Chem. Soc., 2006, 128, 16012
Patent Document 1: WO2006-088217 A1
Non-Patent Document 4: Macromolecules, 2005, 38, 8649

DISCLOSURE OF INVENTION

Problem to be Solved by the Invention

The object of the present invention is to provide a method for producing a block copolymer which comprises two or more blocks composed of aromatic units having different basic structures from each other and has a high molecular weight, a narrow chain length distribution and a narrow molecular weight distribution, and a block copolymer produced by the method.

Means for Solving the Problem

The present invention relates to a method for producing a block copolymer comprising the step of sequentially reacting two or more aromatic compounds which are selected from aromatic compounds represented by the following general formula (V) and are different in the group Ar, in the presence of a nickel complex containing a phosphine compound represented by the following general formula (I) or a palladium complex containing a phosphine compound represented by the following general formula (II) to thereby form blocks derived from the respective aromatic compounds sequentially, wherein the two or more aromatic compounds are reacted in descending order of parameter of aromatic ring charge, the general formula (V):

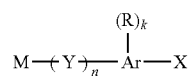
(V)

(wherein Ar represents an organic group having a valence of (2+k) and containing aromatic ring(s), X bonds to the aromatic ring in the Ar, R represents a hydrocarbyl, hydrocarbyloxy, hydrocarbylmercapto, hydrocarbylcarbonyl, hydrocarbyloxycarbonyl, hydrocarbylsulfonyl, hydrocarbylamino or hydrocarbylaminocarbonyl group which may be substituted, k is an integer of 0 or more, in the case of a plurality of R being present, all Rs may be the same or different, and two Rs may form a ring together, X represents a halogen atom, a nitro group or a group represented by $-SO_3Q$ (wherein Q represents a hydrocarbyl group which may be substituted), Y represents an oxygen atom, a sulfur atom, an imino group, a substituted imino group, an ethenylene group, a substituted ethenylene group, or an ethynylene group, n is 0 or 1, M represents a hydrogen atom, $-B(OQ^1)_2$, $-Si(Q^2)_3$, $-Sn(Q^3)_3$ or $-Z^1(Z^2)_m$ (wherein $Q^1$ represents a hydrogen atom or a hydrocarbyl group, two $Q^1$s may be the same or different and two $Q^1$s may form a ring together, $Q^2$ represents a hydrocarbyl group and three $Q^2$s may be the same or different, $Q^3$ represents a hydrocarbyl group and three $Q^3$s may be the same or different, $Z^1$ represents a metal atom or a metal ion, $Z^2$ represents a counter ion, and m is an integer of 0 or more),
the general formula (I):

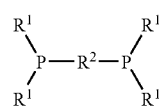
(I)

(wherein $R^1$ represents a hydrocarbyl group which may be substituted, four $R^1$s may be the same or different, and two $R^1$s may form a ring together, and $R^2$ represents a hydrocarbylene group which may be substituted), the general formula (II):

$P(R^3)_3$ (II)

(wherein $R^3$ is a group represented by the following formula (III) or a group represented by the following formula (IV), and three $R^3$s may be the same or different with a proviso that at least one of the three $R^3$s is a group represented by the following formula (III)),

$-C(R^4)_3$ (III)

(wherein $R^4$ represents a hydrogen atom or a hydrocarbyl group which may be substituted, three $R^4$s may be the same or different, and two R⁴s may form a ring together, and two or more R⁴ cannot be hydrogen atoms),

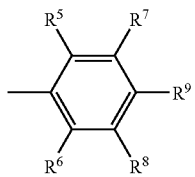

(IV)

(wherein R⁵-R⁹ each represents independently a hydrogen atom, a halogen atom, a hydroxyl group, an amino group, a nitro group, a cyano group, a hydrocarbyl, hydrocarbyloxy, hydrocarbylmercapto, hydrocarbylcarbonyl, hydrocarbyloxycarbonyl, hydrocarbylsulfonyl, hydrocarbylamino or hydrocarbylaminocarbonyl group which may be substituted, at least one of R⁵ and R⁶ is not a hydrogen atom, and R⁵ and R⁷, R⁷ and R⁹, R⁶ and R⁸, and R⁸ and R⁹ may respectively form a ring together).

Here, the parameter of aromatic ring charge is a value (P) or value (Q) which is obtained in the following manner: an aromatic compound model which corresponds to the aromatic compound of the above formula (V) and is represented by the following general formula (VI),

(VI)

(wherein the formula (VI) corresponds to the formula (V) in which M-(Y)$_n$ and X are replaced with hydrogen atom, and H$_M$ represents a hydrogen atom corresponding to M-(Y)$_n$ and H$_X$ represents a hydrogen atom corresponding to X, Ar, R and k are the same as defined above, and H$_X$ bonds to an aromatic ring in Ar) is subjected to structural optimization by the AMI method of semiempirical molecular orbital calculation, then, charges of respective atoms constituting the aromatic compound model are calculated, and the value (P) is obtained by dividing the sum total of charges of carbon atom(s), oxygen atom(s), nitrogen atom(s) and sulfur atom(s) among the respective atoms constituting the aromatic rings which are to be subjected to calculation in the aromatic compound model by the total number of these atoms, and when k is an integer of 1 or more and the aromatic compound model has one or more groups (C) which are bonding to the aromatic ring to be subjected to calculation and are selected from the group consisting of hydrocarbyloxy group which may be substituted, hydrocarbylmercapto group which may be substituted and hydrocarbylamino group which may be substituted as R, the value (Q) is obtained by adding to the above value (P) a value (P') obtained by dividing the total sum of the charges of atoms bonding to the aromatic ring to be subjected to calculation in the groups (C) by the total number of these atoms and further dividing the quotient by 10 (the aromatic ring to be subjected to calculation in the aromatic compound model is as follows: (a) in case the aromatic ring bonding to H$_X$ is a monocyclic aromatic ring, the aromatic ring to be subjected to calculation is the monocyclic aromatic ring, (b) in case the aromatic ring bonding to H$_X$ is an aromatic condensed ring formed by condensation of a plurality of monocyclic aromatic rings, the aromatic ring to be subjected to calculation is the aromatic condensed ring or (c) in case the aromatic ring bonding to H$_X$ is a ring formed by condensation of one or more ring(s) (A) selected from the group consisting of aromatic condensed ring(s) and monocyclic aromatic ring(s) and one or more ring(s) (B) selected from ring(s) other than the ring(s) (A), the aromatic ring to be subjected to calculation is the ring bonding to H$_X$ among ring(s) (A)).

Secondly, the present invention relates to a block copolymer produced by the above method.

Advantages of the Invention

Block copolymers which comprise two or more blocks composed of aromatic units having different basic structures from each other and have a high molecular weight, a narrow chain length distribution and a narrow molecular weight distribution can be obtained according to the method of the present invention.

BEST MODE FOR CARRYING OUT THE INVENTION

<Method for Production of Block Copolymer>

The method of the present invention comprises the step of sequentially reacting two or more aromatic compounds which are selected from aromatic compounds represented by the above general formula (V) and are different in the group Ar, in the presence of a nickel complex containing a phosphine compound represented by the above general formula (I) or a palladium complex containing a phosphine compound represented by the above general formula (II) to thereby form blocks derived from the respective aromatic compounds sequentially, wherein the above two or more aromatic compounds are reacted in descending order of parameter of aromatic ring charge.

If only the aromatic compounds which are the same in the group Ar in the formula (V) are reacted, sufficient functionality cannot sometimes be given to the resulting block copolymer. Preferably two to six, more preferably two to four, further preferably two or three aromatic compounds which are different in the group Ar in the formula (V) are used. As far as the aromatic compounds include two or more aromatic compounds different in the group Ar in the formula (V), there may be included any number of the aromatic compounds which are the same in the group Ar.

Aromatic Compounds

The group Ar in the formula (V) is an organic group containing aromatic ring(s) and having a valence of (2+k). The organic group is a residue formed by eliminating (2+k) hydrogen atoms from aromatic ring(s) of an organic compound containing aromatic ring(s).

The aromatic rings include monocyclic aromatic rings, condensed aromatic rings, etc.

As the condensed aromatic rings, mention may be made of rings formed by condensation of two or more of monocyclic aromatic rings selected independently one another from the above monocyclic aromatic rings (hereinafter sometimes referred to as aromatic condensed ring); rings formed by condensation of one or more rings (A) selected from the group consisting of aromatic condensed ring(s) and monocyclic aromatic ring(s) and one or more ring(s) (B) selected from ring(s) other than the ring(s) (A); and the like.

As for the condensed aromatic ring, the number of the monocyclic aromatic rings to be condensed is preferably 2-4, more preferably 2-3.

The monocyclic aromatic rings include, for example, the following rings.
  1
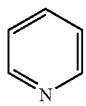  2
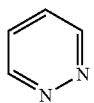  3
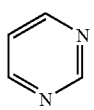  4
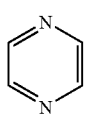  5
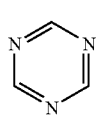  6
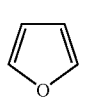  7
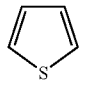  8
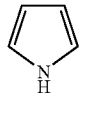  9
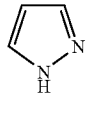  10
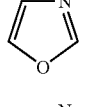  11
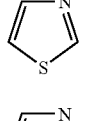  12
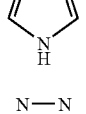  13
  14
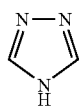  15
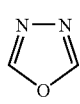  16
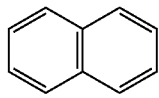  17
The condensed aromatic rings include, for example, the following rings.
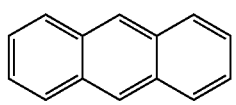  18
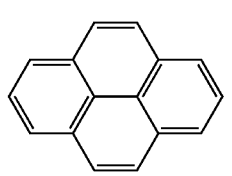  19
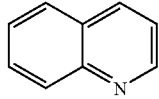  20
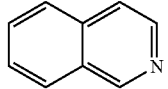  21
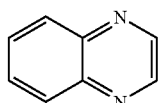  22
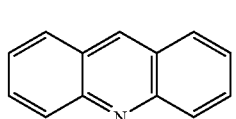  23
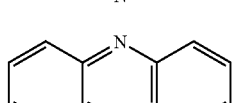  24
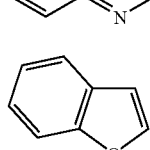  25
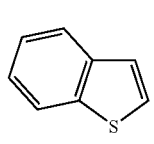  26

29 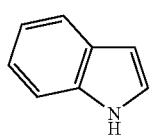
30 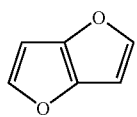
31 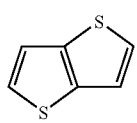
32 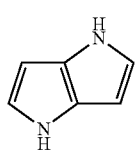
33 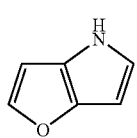
34 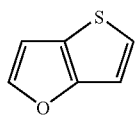
35 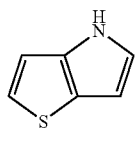
36 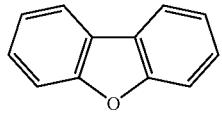
37 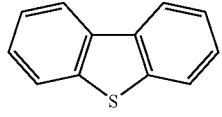
38 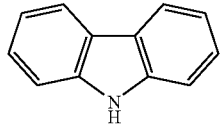
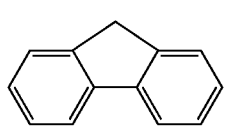
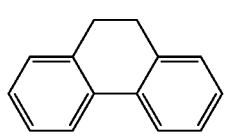
57 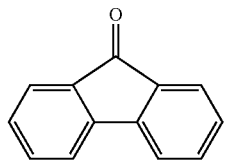
58 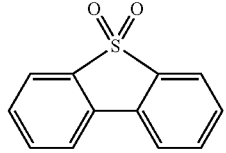
59 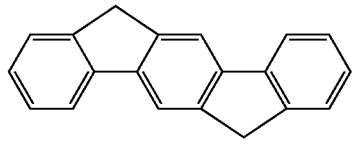
60 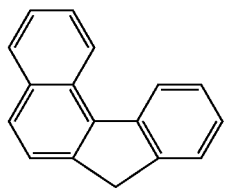
61 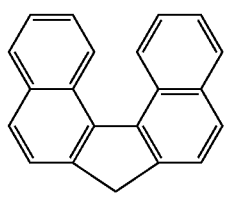
62 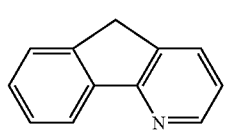
63 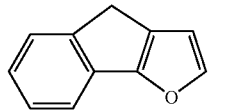
64 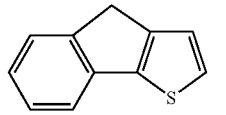
65 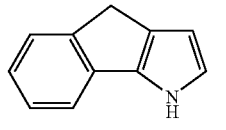
66 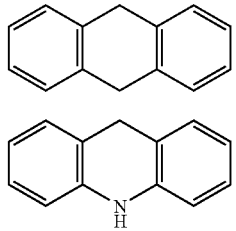
67

-continued

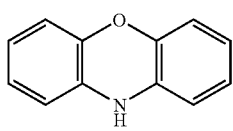
68

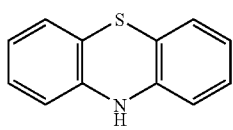
69

As the organic compounds containing aromatic ring, mention may be made of, for example, (i) an organic compound comprising one aromatic ring, and (ii) an organic compound comprising two or more aromatic rings which are linked through a single bond or a divalent group such as methylene group, ethylene group, ethenylene group, ethynylene group, oxygen atom, sulfur atom, imino group, carbonyl group or sulfonyl group.

The number of the aromatic rings linked (monocyclic aromatic ring and/or condensed aromatic ring) is preferably 2-4, more preferably 2-3, further preferably 2.

(i) Specific examples of the organic compound comprising one aromatic ring are the same as those of the above monocyclic aromatic rings and condensed aromatic rings.

(ii) Specific examples of the organic compound comprising two or more aromatic rings which are linked through a single bond, a divalent group or the like are as follows.

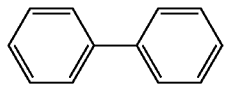
39

40

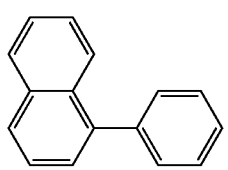
41

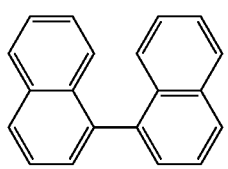
42

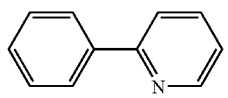
43

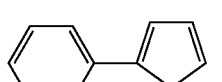
44

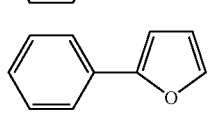
45

-continued

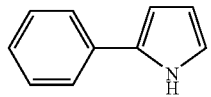
46

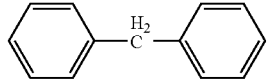
47

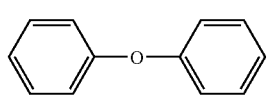
48

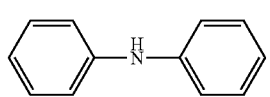
49

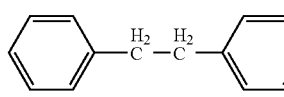
50

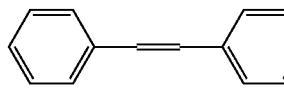
51

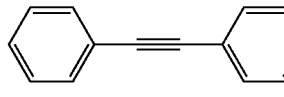
52

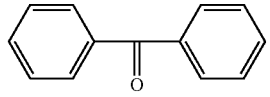
53

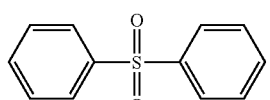
54

The group Ar is preferably an organic group derived from 1, 2, 7, 8, 9, 12, 13, 14, 18, 19, 22, 23, 26, 27, 28, 29, 36, 37, 38, 39, 40, 41, 42, 43, 47, 48, 49, 50, 51, 52, 53, 54, 55, 56, 57, 59, 60, 68 or 69, more preferably an organic group derived from 1, 2, 7, 8, 9, 12, 13, 14, 18, 22, 36, 37, 38, 39, 49, 51, 52, 55, 60, 68 or 69, further preferably an organic group derived from 1, 2, 7, 8, 9, 12, 13, 14, 18, 39, 49, 55, 60, 68 or 69, especially preferably an organic group derived from 1, 8, 9 or 55.

R in the general formula (V) represents a hydrocarbyl group (monovalent hydrocarbon group) which may be substituted, a hydrocarbyloxy group which may be substituted, a hydrocarbylmercapto group which may be substituted, a hydrocarbylcarbonyl group which may be substituted, a hydrocarbyloxycarbonyl group which may be substituted, a hydrocarbylsulfonyl group which may be substituted, a hydrocarbylamino group which may be substituted or a hydrocarbylaminocarbonyl group which may be substituted. In the case of a plurality of R being present, all Rs may be the same or different, and two Rs may form a ring together.

When the Rs bond to carbon atoms in the organic group represented by Ar, Rs are independently of one another a hydrocarbyl group, a hydrocarbyloxy group which may be substituted, a hydrocarbylmercapto group which may be substituted, a hydrocarbylcarbonyl group which may be substituted, a hydrocarbyloxycarbonyl group which may be substituted, a hydrocarbylsulfonyl group which may be substituted, a hydrocarbylamino group which may be substituted or a hydrocarbylaminocarbonyl group which may be substituted, preferably a hydrocarbyl group which may be substituted, a hydrocarbyloxy group which may be substituted, a hydrocarbylmercapto group which may be substituted, a hydrocarbylcarbonyl group which may be substituted or hydrocarbylamino group which may be substituted, and more preferably a hydrocarbyl group which may be substituted, a hydrocarbyloxy group which may be substituted, a hydrocarbylmercapto group which may be substituted or hydrocarbyl-disubstituted amino group which may be substituted.

When R bonds to nitrogen atom in the organic group represented by Ar, R is a hydrocarbyl group which may be substituted. Furthermore, when the group represented by R has a plurality of substituents, two substituents may link to each other to form a ring, and examples thereof are as shown below.

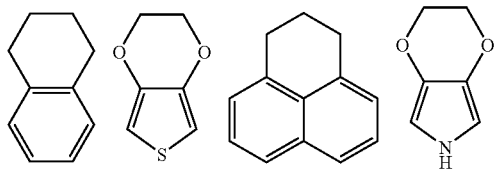

Definitions and examples of the hydrocarbyl group in R are the same as those in explanation of $R^1$ of the general formula (1) given hereinafter. The hydrocarbyloxy group, hydrocarbylmercapto group, hydrocarbylcarbonyl group, hydrocarbyloxycarbonyl group or hydrocarbylsulfonyl group is a group in which one hydrocarbyl group mentioned above is bonded to oxy group, mercapto group, carbonyl group, oxycarbonyl group or sulfonyl group, respectively. The hydrocarbyl-mono-substituted or di-substituted amino group is a group in which one or two hydrocarbyl groups mentioned above are bonded to an amino group. The hydrocarbylaminocarbonyl group is a group in which one or two hydrocarbyl groups mentioned above are bonded to an aminocarbonyl group.

For the hydrocarbyl group, hydrocarbyloxy group, hydrocarbylmercapto group, hydrocarbylcarbonyl group, hydrocarbyloxycarbonyl group, hydrocarbylsulfonyl group, hydrocarbylamino group and hydrocarbylaminocarbonyl group of R, a part or all of hydrogen atoms contained in these groups may be substituted with halogen atom, hydroxyl group, amino group, nitro group, cyano group, hydrocarbyloxy group which may be substituted, hydrocarbylmercapto group which may be substituted, hydrocarbylcarbonyl group which may be substituted, hydrocarbyloxycarbonyl group which may be substituted, hydrocarbylsulfonyl group which may be substituted, hydrocarbylamino group which may be substituted, hydrocarbylaminocarbonyl group which may be substituted, or the like.

R is preferably a hydrocarbyl group, hydrocarbyloxy group, hydrocarbyl-di-substituted amino group, hydrocarbylmercapto group, hydrocarbylcarbonyl group, hydrocarbyloxycarbonyl group, hydrocarbylaminocarbonyl group or hydrocarbylsulfonyl group of 1-20 carbon atoms, more preferably a hydrocarbyl group, hydrocarbyloxy group, hydrocarbylamino group or hydrocarbylmercapto group of 2-12 carbon atoms, further preferably a hydrocarbyl group or hydrocarbyloxy group of 3-10 carbon atoms, and especially preferably an alkyl group or alkoxy group of 3-10 carbon atoms.

Specific examples of divalent groups of the general formula (V) from which $M-(Y)_n$ and X are eliminated are as follows.

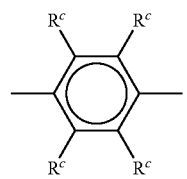 (C-1)

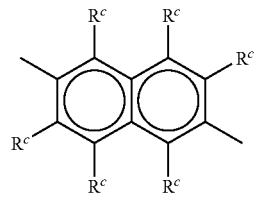 (C-2)

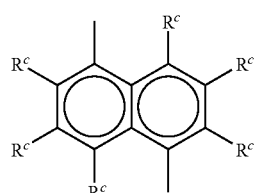 (C-3)

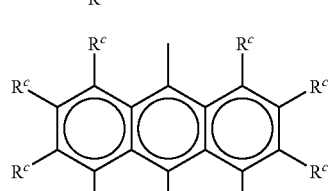 (C-4)

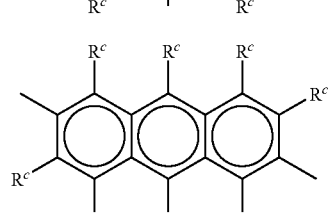 (C-5)

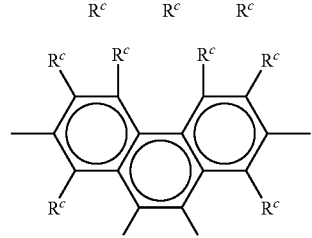 (C-6)

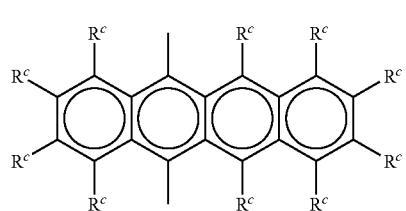 (C-7)

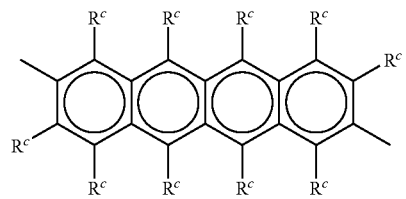 (C-8)

(C-9)
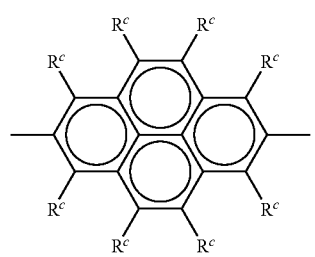
(C-10)
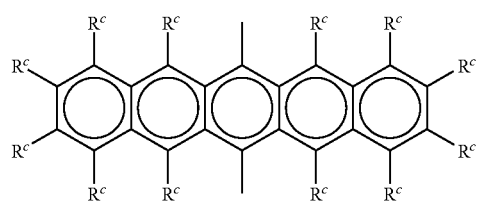
(C-11)
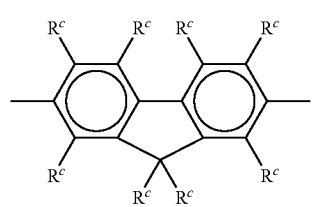
(C-12)
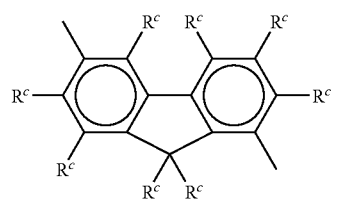
(C-13)
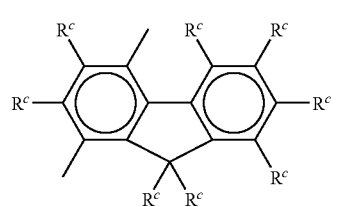
(C-14)
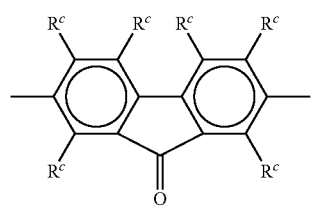
(C-15)
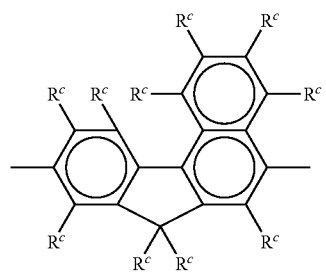
(C-16)
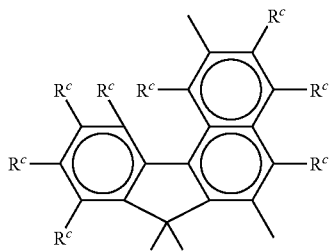
(C-17)
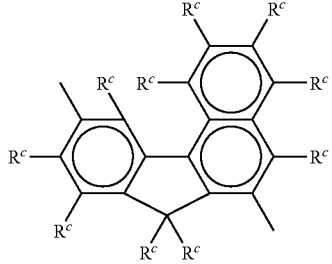
(C-18)
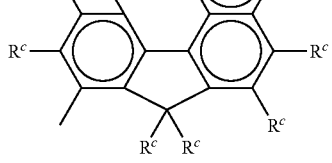
(C-19)
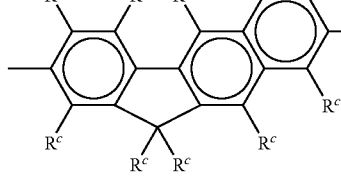
(C-20)
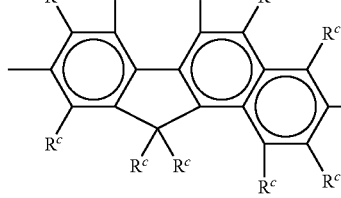
(C-21)
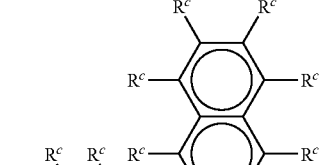

(C-22) 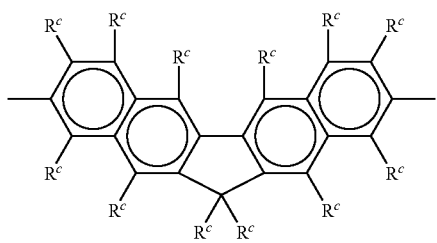
(D-1) 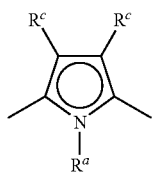
(D-2) 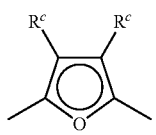
(D-3) 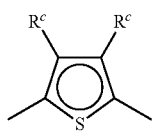
(D-4) 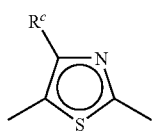
(D-5) 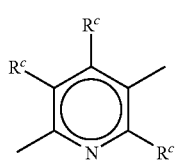
(D-6) 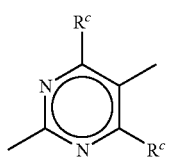
(D-7) 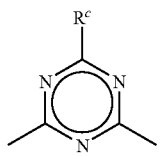
(D-8) 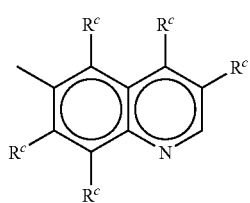
(D-9) 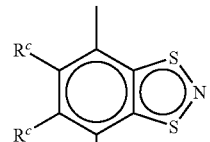
(D-10) 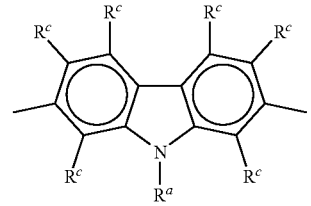
(D-11) 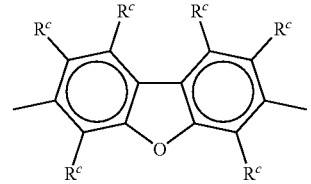
(D-12) 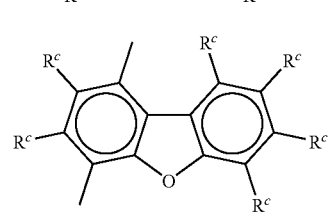
(D-13) 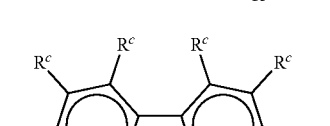
(D-14) 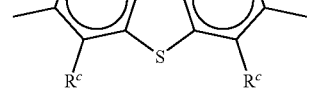
(D-15) 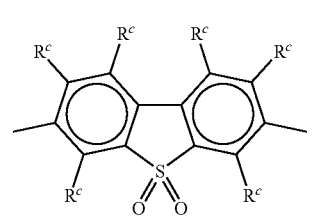
(D-16) 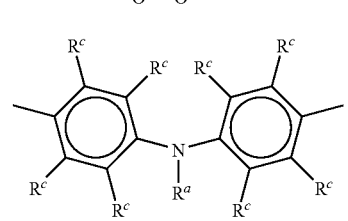

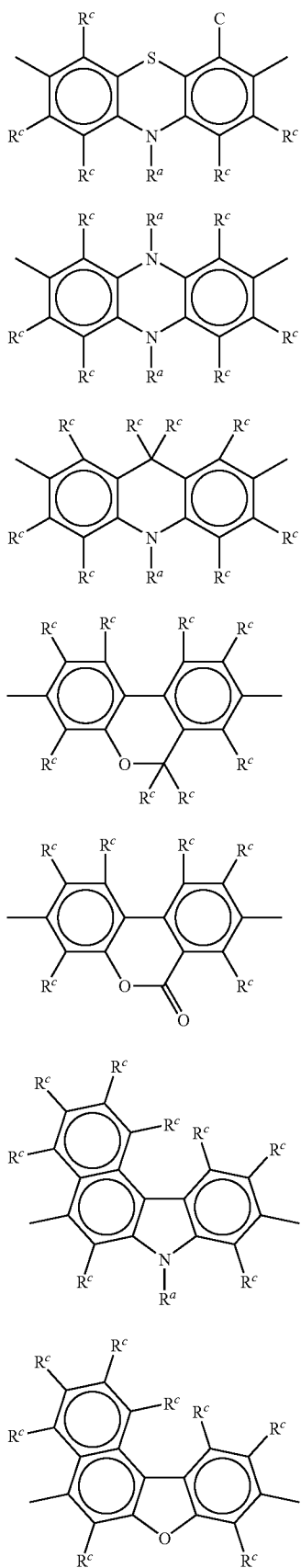

(D-17)
(D-18)
(D-19)
(D-20)
(D-21)
(D-22)
(D-23)

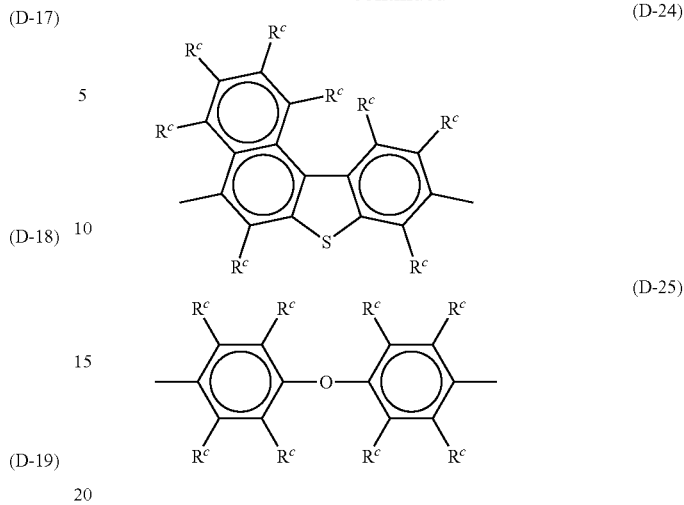

(D-24)

(D-25)

(in the above formulas, $R^a$ and $R^c$ are the same as those represented by R in the general formula (V)).

In the general formula (V), k is an integer of 0 or more, preferably an integer of 0-4, more preferably an integer of 1-3, and further preferably 1 or 2.

In the general formula (V), X is a halogen atom, a nitro group or a group represented by —$SO_3Q$ (wherein Q represents a hydrocarbyl group which may be substituted). X bonds to carbon atom in the aromatic ring contained in the organic group represented by Ar.

Examples of the halogen atom represented by X are fluorine atom, chlorine atom, bromine atom and iodine atom, and chlorine atom, bromine atom and iodine atom are preferred.

As the hydrocarbyl group represented by Q in the group represented by —$SO_3Q$, mention may be made of the specific examples and preferred examples of the hydrocarbyl group represented by R. The hydrocarbyl group represented by Q may be substituted, and the substituents include, for example, fluorine atom.

Preferred specific examples of the group represented by —$SO_3Q$ are methanesulfonate group, benzenesulfonate group, p-toluenesulfonate group, trifluoromethanesulfonate group, and the like.

X is preferably a halogen atom and a group represented by —$SO_3Q$, more preferably chlorine atom, bromine atom, iodine atom and a group represented by —$SO_3Q$, further preferably chlorine atom, bromine atom, iodine atom and trifluoromethanesulfonate group, and especially preferably chlorine atom, bromine atom and iodine atom.

Y in the general formula (V) is oxygen atom, sulfur atom, imino group, substituted imino group, ethenylene group, substituted ethenylene group or ethynylene group, preferably oxygen atom, imino group, substituted imino group or ethynylene group, more preferably oxygen atom, imino group or substituted imino group, further preferably oxygen atom or imino group. Y bonds to carbon atom in the aromatic ring contained in the organic group represented by Ar.

In the general formula (V), n is 0 or 1, preferably 0.

The substituted imino group represented by Y is a group represented by —N(Q')— (wherein Q' represents a substituent). The substituents represented by Q' include, for example, a hydrocarbyl group. As specific examples of the hydrocarbyl group, mention may be made of the specific examples of hydrocarbyl group represented by R mentioned above.

The substituted ethenylene group represented by Y is a group represented by —C(Q'')═C(Q''')— (wherein Q'' and Q''' each independently represents a hydrogen atom or a substituent, with a proviso that at least one of Q'' and Q''' is a substituent). The substituents represented by Q'' and Q''' include, for example, hydrocarbyl group. As specific examples of the hydrocarbyl group, mention may be made of the specific examples and preferred examples of the hydrocarbyl group represented by R mentioned above.

In the general formula (V), M represents a hydrogen atom, $-B(OQ^1)_2$, $-Si(Q^2)_3$, $-Sn(Q^3)_3$ or $-Z^1(Z^2)_m$ (wherein $Q^1$ represents a hydrogen atom or a hydrocarbyl group, two $Q^1$s may be the same or different and two $Q^1$s may form a ring together, $Q^2$ represents a hydrocarbyl group and three $Q^2$s may be the same or different, $Q^3$ represents a hydrocarbyl group and three $Q^3$s may be the same or different, $Z^1$ represents a metal atom or a metal ion, $Z^2$ represents a counter ion, and m is an integer of 0 or more). When n is 0, M bonds to carbon atom in the aromatic ring contained in the organic group represented by Ar.

$Q^1$ in $-B(OQ^1)_2$ represents a hydrogen atom or a hydrocarbyl group. Two $Q^1$s may be the same or different and two $Q^1$s may form a ring together. The hydrocarbyl group represented by $Q^1$ is the same as that explained and exemplified as monovalent hydrocarbyl group represented by R mentioned above, and is preferably an alkyl group, more preferably methyl group, ethyl group, propyl group, isopropyl group, butyl group, isobutyl group, pentyl group, hexyl group or nonyl group, and further preferably methyl group, ethyl group, propyl group, butyl group, pentyl group or hexyl group. When two $Q^1$s form a ring together, the group comprising the two $Q^1$s (namely, hydrocarbylene group) is preferably 1,2-ethylene group, 1,1,2,2-tetramethyl-1,2-ethylene group, 1,3-propylene group, 2,2-dimethyl-1,3-propylene group or 1,2-phenylene group.

$Q^2$ in $-Si(Q^2)_3$ represents a hydrocarbyl group. Three $Q^2$s may be the same or different. The hydrocarbyl group represented by $Q^2$ is the same as that explained and exemplified as hydrocarbyl group represented by R mentioned above, and is preferably an alkyl group, more preferably methyl group, ethyl group, propyl group, isopropyl group, butyl group, isobutyl group, pentyl group, hexyl group or nonyl group, and further preferably methyl group, ethyl group, propyl group, butyl group, pentyl group or hexyl group.

$Q^3$ in $-Sn(Q^3)_3$ represents a hydrocarbyl group. Three $Q^3$s may be the same or different. The hydrocarbyl group represented by $Q^3$ is the same as that explained and exemplified as hydrocarbyl group represented by R mentioned above, and is preferably an alkyl group, more preferably methyl group, ethyl group, propyl group, isopropyl group, butyl group, isobutyl group, pentyl group, hexyl group or nonyl group, and further preferably methyl group, ethyl group, propyl group, butyl group, pentyl group or hexyl group.

In $-Z^1(Z^2)_m$, $Z^1$ represents a metal atom or a metal ion, $Z^2$ represents a counter ion, and m is an integer of 0 or more. Specific examples of the metal and metal ion are atoms or ions of alkali metals such as Li, Na, K, Rb and Cs, alkaline earth metals such as Be, Mg, Ca, Sr and Ba, Al, Ga, In, Tl, Pb, Sc, Ti, V, Cr, Mn, Fe, Co, Ni, Cu, Zn, Y, Zr, Nb, Mo, Tc, Ru, Rh, Ag, Cd, La, Ce, Sm, Eu, Hf, Ta, W, Re, Os, Ir, Pt, Au, Hg, and the like, preferred are atoms or ions of alkali metals such as Li, Na, K, Rb and Cs, alkaline earth metals such as Be, Mg, Ca, Sr and Ba, and Al, Ga, In, Tl, Pb, Sc, Ti, Cu, Zn, Y, Zr, Ag and Hg, more preferred are atoms or ions of Li, Na, K, Rb, Cs, Be, Mg, Ca, In, Tl, Pb, Cu, Zn, Zr, Ag and Hg, and further preferred are atoms or ions of Li, Na, K, Mg, Ca, Cu and Zn.

In $-Z^1(Z^2)_m$, $Z^2$ represents a counter ion, usually an anion. Usually, a conjugated base of Brønsted acid is used for the counter ion, and specific examples thereof are halide ions such as fluoride ion, chloride ion, bromide ion and iodide ion, sulfate ion, nitrate ion, carbonate ion, perchlorate ion, tetrafluoroborate ion, hexafluorophosphate ion, methanesulfonate ion, trifluoromethanesulfonate ion, toluenesulfonate ion, acetate ion, trifluoroacetate ion, propionate ion, benzoate ion, hydroxide ion, oxide ion, methoxide ion, and ethoxide ion, preferably chloride ion, bromide ion, iodide ion, sulfate ion, nitrate ion, carbonate ion, methanesulfonate ion, trifluoromethanesulfonate ion, toluenesulfonate ion, acetate ion, trifluoroacetate ion, propionate ion, and benzoate ion, more preferably chloride ion, bromide ion, iodide ion, methanesulfonate ion, trifluoromethanesulfonate ion, toluenesulfonate ion, acetate ion, and trifluoroacetate ion, and further preferably chloride ion, bromide ion, iodide ion, methanesulfonate ion, trifluoromethanesulfonate ion, acetate ion, and trifluoroacetate ion, most preferably chloride ion, bromide ion and iodide ion.

In $-Z^1(Z^2)_m$, m is determined so that the aromatic compound represented by the general formula (V) becomes electrically neutral. When M is $-Z^1(Z^2)_m$ (namely, when the aromatic compound represented by the general formula (V) is represented by $-Z^1(Z^2)_m-(Y)_n-Ar-X$), the portion of $-Z^1(Z^2)_m$ is regarded to have a valence of +1, the portion of $(Y)_n-Ar-X$ is regarded to have a valence of −1, and the portion of $Z^1(Z^2)_m$ and that of $(Y)_n-Ar-X$ are regarded to be bonded through ionic bonding.

M is preferably $-B(OQ^1)_2$, $-Si(Q^2)_3$, $-Sn(Q^3)_3$ or $-Z^1(Z^2)_m$, and more preferably $-B(OQ^1)_2$ or $-Z^1(Z^2)_m$.

Nickel Complex—

The nickel complex which can be used in the production method of the present invention contains a phosphine compound represented by the above general formula (I).

$R^1$ in the general formula (I) represents a hydrocarbyl group which may be substituted. Four $R^1$s may be the same or different, and two $R^1$s may form a ring together.

As hydrocarbyl group represented by $R^1$, mention may be made of, for example, alkyl groups of about 1-50 carbon atoms such as methyl group, ethyl group, propyl group, isopropyl group, butyl group, isobutyl group, t-butyl group, pentyl group, hexyl group, nonyl group, dodecyl group, pentadecyl group, octadecyl group and docosyl group; cyclic saturated hydrocarbon groups of about 3-50 carbon atoms such as cyclopropyl group, cyclobutyl group, cyclobutyl group, cyclopentyl group, cyclohexyl group, cyclononyl group, cyclododecyl group, norbonyl group and adamantyl group; alkenyl groups of about 2-50 carbon atoms such as ethenyl group, propenyl group, 3-butenyl group, 2-butenyl group, 2-pentenyl group, 2-hexenyl group, 2-nonenyl group and 2-dodecenyl group; aryl groups of about 6-50 carbon atoms such as phenyl group, 1-naphthyl group, 2-naphthyl group, 2-methylphenyl group, 3-methylphenyl group, 4-methylphenyl group, 4-ethylphenyl group, 4-propylphenyl group, 4-isopropylphenyl group, 4-butylphenyl group, 4-t-butylphenyl group, 4-hexylphenyl group, 4-cyclohexylphenyl group, 4-adamantylphenyl group and 4-phenylphenyl group; and aralkyl groups of about 7-50 carbon atoms such as phenylmethyl group, 1-phenylenethyl group, 2-phenylethyl group, 1-phenyl-1-propyl group, 1-phenyl-2-propyl group, 2-phenyl-2-propyl group, 3-phenyl-1-propyl group, 4-phenyl-1-butyl group, 5-phenyl-1-pentyl group and 6-phenyl-1-hexyl group.

The hydrocarbyl group represented by $R^1$ may be substituted, and specifically a part or all of hydrogen atoms in the hydrocarbyl group may be substituted, for example, with halogen atom, hydroxyl group, amino group, nitro group, cyano group, hydrocarbyloxy group which may be substituted, hydrocarbylmercapto group which may be substituted, hydrocarbylcarbonyl group which may be substituted, hydrocarbyloxycarbonyl group which may be substituted, hydrocarbylsulfonyl group which may be substituted, hydrocarbylamino group which may be substituted, hydrocarbylaminocarbonyl group which may be substituted, or the like.

The above hydrocarbyloxy group, hydrocarbylmercapto group, hydrocarbylcarbonyl group, hydrocarbyloxycarbonyl group or hydrocarbylsulfonyl group is a group in which one hydrocarbyl group mentioned above is bonded to oxy group, mercapto group, carbonyl group, oxycarbonyl group or sulfonyl group. The hydrocarbyl amino group is a group in which one or two hydrocarbyl groups mentioned above are bonded to amino group (mono(hydrocarbyl)amino group or di(hydrocarbyl)amino group). The hydrocarbylaminocarbonyl group is a group in which one or two hydrocarbyl groups mentioned above are bonded to aminocarbonyl group (mono (hydrocarbyl)aminocarbonyl group or di(hydrocarbyl)aminocarbonyl group).

$R^1$ is preferably an alkyl group of 1-20 carbon atoms, a cycloalkyl group of 3-20 carbon atoms, an aryl group of 6-20 carbon atoms or an aralkyl group of 7-20 carbon atoms, more preferably an alkyl group of 1-12 carbon atoms, cycloalkyl group of 3-12 carbon atoms or an aryl group of 6-12 carbon atoms, further preferably an alkyl group of 1-6 carbon atoms, cycloalkyl group of 3-6 carbon atoms or an aryl group, and especially preferably isopropyl group, t-butyl group, cyclohexyl group or phenyl group.

$R^2$ represents a hydrocarbylene group (divalent hydrocarbon group) which may be substituted.

The two phosphorus groups in the general formula (I) are desirably bonded through two or three carbon atoms. In this case, there is obtained an aromatic polymer having particularly a narrow molecular weight distribution. In other words, the two phosphorus groups are desirably bonded through a divalent group represented by —$(CR^*_2)_s$— (wherein s is 2 or 3, and $R^*$ each independently represents a hydrogen atom or a substituent or two $R^*$s may form a ring together). When explanation is made taking 1,2-ethylene group, 1,3-propylene group, 1,2-phenylene group and 1,3-phenylene group as examples, the number of carbon atoms present between the two phosphorus atoms is counted in such a manner that the number of the carbon atoms is in minimum, for example, it is counted as shown by numbers given in the following structural formulas.

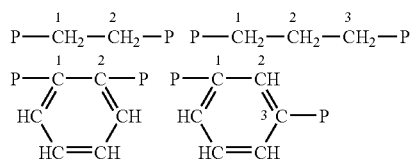

If as in the case of $R^2$ being 1,1'-ferrocenylene group, the two phosphorus atoms are too remote from each other, or the two phosphorus atoms are bonded through atoms other than carbon, aromatic polymers of high molecular weight and narrow molecular weight distribution cannot sometimes be obtained.

Specific examples of hydrocarbylene group which is represented by $R^2$ and may be substituted are 1,2-ethylene group which may be substituted, 1,3-propylene group which may be substituted, 1,2-phenylene group which may be substituted, 1,3-phenylene group which may be substituted, and the like. In the case of the hydrocarbylene group represented by $R^2$ being substituted, specifically, a part or all of the hydrogen atoms in the hydrocarbylene group may be substituted with a group of $R^1$ which may be substituted.

$R^2$ is preferably 1,2-ethylene group which may be substituted, 1,3-propylene group which may be substituted or 1,2-phenylene group which may be substituted, more preferably 1,2-ethylene group, 1-methyl-1,2-ethylene group, 1,2-dimethyl-1,2-ethylene group, 1,1-dimethyl-1,2-ethylene group, 1,1,2,2-tetramethyl-1,2-ethylene group, 1,3-propylene group, 2,2-dimethyl-1,3-propylene group or 1,2-phenylene group, further preferably 1,2-ethylene group, 1,3-propylene group or 1,2-phenylene group, and especially preferably 1,2-ethylene group or 1,3-propylene group.

The nickel complex is preferably a complex comprising a phosphine compound represented by the general formula (I) and a nickel (0) or nickel (II) salt, more preferably a complex comprising a phosphine compound represented by the general formula (II) and a nickel (II) salt.

The nickel complex containing the phosphine compound may be used for polycondensation without being isolated or may be used after being isolated.

Examples of the nickel (II) salt are nickel fluoride, nickel chloride, nickel bromide, nickel iodide, nickel nitrate, nickel sulfate, nickel carbonate, nickel phosphate, nickel acetate, nickel methanesulfonate, nickel trifluoromethanesulfonate, nickel toluenesulfonate, and the like, and nickel chloride, nickel bromide and nickel iodide are preferred, nickel chloride and nickel bromide are more preferred, and nickel chloride is further preferred.

The phosphine compound represented by the general formula (I) is in an amount of usually 0.5-10 mols, preferably 0.8-5 mols, more preferably 0.9-3 mols based on one mol of the nickel (0) or nickel (II) salt.

The nickel complex is preferably Ni(dppe)Cl$_2$ [namely, nickel-1,2-bis(diphenylphosphino)ethane-dichloride], or Ni(dppp)Cl$_2$ [namely, nickel-1,3-bis(diphenylphosphino) propane-dichloride].

In the nickel complex used for the production method of the present invention, the phosphine compound represented by the general formula (I) is in an amount of usually 0.5-4 mols, preferably 0.8-2 mols, more preferably 0.9-1.1 mol based on one mol of the nickel (0) or nickel (II) salt.

The nickel complex is preferably Ni(dppe)Cl$_2$ [namely, nickel-1,2-bis(diphenylphosphino)ethane-dichloride], or Ni(dppp)Cl$_2$ [namely, nickel-1,3-bis(diphenylphosphino) propane-dichloride].

Palladium Complex—

The palladium complex which can be used for the production method of the present invention contains a phosphine compound represented by the general formula (II).

$R^3$ in the general formula (II) is a group represented by the general formula (III) or a group represented by the general formula (IV), and three $R^3$s may be the same or different and at least one of the three $R^3$s is a group represented by the formula (III).

In the general formula (III), $R^4$ is a hydrogen atom or a hydrocarbyl group which may be substituted, and three $R^4$s may be the same or different, two $R^4$s may form together a ring, and two or more $R^4$s cannot be hydrogen atoms (namely, when $R^4$s do not form a ring together, at least two $R^4$s are hydrocarbyl groups which may be substituted).

The group represented by the general formula (III) is preferably t-butyl group, 3-ethyl-3-pentyl group, isopropyl group, isobutyl group, 3-pentyl group, cyclopentyl group, 1-methylcyclohexyl group or cyclohexyl group, more preferably t-butyl group, cyclopentyl group or cyclohexyl group, and further preferably t-butyl group or cyclohexyl group.

In the group represented by the general formula (IV), $R^5$-$R^9$ each represents independently a hydrogen atom, a halogen atom, a hydroxyl group, an amino group, a nitro group, a cyano group, a hydrocarbyl group which may be substituted, a hydrocarbyloxy group which may be substituted, a hydrocarbylmercapto group which may be substituted, a hydrocarbylcarbonyl group which may be substituted, a hydrocarbyloxycarbonyl group which may be substituted, a hydrocarbylsulfonyl group which may be substituted, a hydrocarbylamino group which may be substituted or a hydrocarbylaminocarbonyl group which may be substituted; at least one of $R^5$ and $R^6$ is not a hydrogen atom; and $R^5$ and $R^7$, $R^7$ and $R^9$, $R^6$ and $R^8$, and $R^8$ and $R^9$ may respectively form a ring together.

$R^5$-$R^9$ of the general formula (IV) are preferably hydrogen atom, hydrocarbyl group which may be substituted, hydrocarbyloxy group which may be substituted and di(hydrocarbyl)amino group which may be substituted, more preferably hydrogen atom, hydrocarbyl group which may be substituted and hydrocarbyloxy group which may be substituted, and further preferably hydrogen atom and hydrocarbyl group which may be substituted.

As the group of the general formula (IV), mention may be made of 2-methylphenyl group, 2,6-dimethylphenyl group, 2,4,6-trimethylphenyl group, 2-ethylphenyl group, 2,6-diethylphenyl group, 2-isopropylphenyl group, 2,6-diisopropylphenyl group, 2-t-butylphenyl group, 2-phenylphenyl group, 2,6-diphenylphenyl group, 2-methoxyphenyl group, 2,6-dimethoxyphenyl group, 2,4,6-trimethoxyphenyl group, 2-ethoxyphenyl group, 2,6-diethoxyphenyl group, 2-isopropoxyphenyl group, 2,6-diisopropoxyphenyl group, 2-t-butoxyphenyl group, 2-phenoxyphenyl group, 2,6-diphenoxyphenyl group, 2-(2-methylphenyl)phenyl group, 2-(2,6-dimethylphenyl)phenyl group, 2-(2-ethylphenyl)phenyl group, 2-(2,6-diethylphenyl)phenyl group, 2-(2-isopropylphenyl)phenyl group, 2-(2,6-di-isopropylphenyl)phenyl group, 2-(2-t-butylphenyl)phenyl group, 2-(2-methoxyphenyl)phenyl group, 2-(2,6-dimethoxyphenyl)phenyl group, 2-(2,4,6-trimethoxyphenyl)phenyl group, 2-(2-ethoxyphenyl)phenyl group, 2-(2,6-diethoxyphenyl)phenyl group, 2-(2-isopropoxyphenyl)phenyl group, 2-(2,6-diisopropoxyphenyl)phenyl group, 2-(2-t-butoxyphenyl)phenyl group, 2-(2,6-t-butoxyphenyl)phenyl group, etc. Among them, preferred are 2-methylphenyl group, 2-ethylphenyl group, 2-isopropylphenyl group, 2-t-butylphenyl group, 2-phenylphenyl group, 2-methoxyphenyl group, 2-ethoxyphenyl group, 2-isopropoxyphenyl group, 2-t-butoxyphenyl group, 2-phenoxyphenyl group, 2-(2-methylphenyl)phenyl group, 2-(2,6-dimethylphenyl)phenyl group, 2-(2-ethylphenyl)phenyl group, 2-(2,6-diethylphenyl)phenyl group, 2-(2-isopropylphenyl)phenyl group, 2-(2,6-di-isopropylphenyl)phenyl group, 2-(2-t-butylphenyl)phenyl group, 2-(2-methoxyphenyl)phenyl group, 2-(2,6-dimethoxyphenyl)phenyl group, 2-(2,4,6-trimethoxyphenyl)phenyl group, 2-(2-ethoxyphenyl)phenyl group, 2-(2,6-diethoxyphenyl)phenyl group, 2-(2-isopropoxyphenyl)phenyl group, 2-(2,6-diisopropoxyphenyl)phenyl group, 2-(2-t-butoxyphenyl)phenyl group, 2-(2,6-t-butoxyphenyl)phenyl group, and further preferred are 2-(2,6-dimethylphenyl)phenyl group, 2-(2,6-diethylphenyl)phenyl group, 2-(2,6-di-isopropylphenyl)phenyl group, 2-(2-t-butylphenyl)phenyl group, 2-(2,6-dimethoxyphenyl)phenyl group, 2-(2-ethoxyphenyl)phenyl group, 2-(2,6-diethoxyphenyl)phenyl group, 2-(2,6-diisopropoxyphenyl)phenyl group, and 2-(2,6-t-butoxyphenyl)phenyl group.

The palladium complex containing the phosphine compound represented by the general formula (II) can be prepared, for example, by mixing the phosphine compound with a solubilized Pd(0) complex such as palladium (0).dibenzylideneacetone, and furthermore can be prepared by reducing an acetate salt or chloride of palladium (II) in the presence of the phosphine compound to produce palladium (0). The method for producing the palladium complex is disclosed, for example, in Chem. Rev. 102, 1359 (2002) and reference literatures cited therein.

The palladium complex containing the phosphine compound may be used for polycondensation without being isolated or may be used after being isolated.

The amount of the phosphine compound used is not limited, and is preferably from 0.5 to 10, more preferably from 0.8 to 5, further preferably from 0.9 to 3 in molar ratio to palladium (0).

Production of Block Copolymer

The method for production of the block copolymer according to the present invention comprises sequentially contacting two or more aromatic compounds which are selected from aromatic compounds represented by the above general formula (V) and are different in the group Ar, in the presence of a nickel complex containing a phosphine compound represented by the above general formula (I) or a palladium complex containing a phosphine compound represented by the above general formula (II), wherein the two or more aromatic compounds are reacted in descending order of parameter of aromatic ring charge.

In the production method of the present invention, two or more aromatic compounds which are selected from aromatic compounds represented by the general formula (V) and are different in the group Ar are sequentially contacted in descending order of parameter of aromatic ring charge. If they are not contacted in descending order of parameter of aromatic ring charge, the chain length distribution of each copolymer component and the molecular weight distribution of the block copolymer become broader.

In the present invention, the parameter of aromatic ring charge is defined as follows. When an aromatic compound model corresponding to the aromatic compound of the above formula (V) and represented by the following general formula (VI):

(VI)

(wherein the formula (VI) corresponds to the formula (V) in which M-$(Y)_n$ and X are replaced with hydrogen atom, and $H_M$ represents a hydrogen atom corresponding to M-$(Y)_n$ and $H_X$ represents a hydrogen atom corresponding to X; Ar, R and k are the same as defined above; and $H_X$ bonds to an aromatic ring in Ar) is subjected to optimization of structure by the AMI method of semiempirical molecular orbital calculation, thereafter, charges of respective atoms constituting the aromatic compound model are calculated, and the sum total of charges of carbon atom(s), oxygen atom(s), nitrogen atom(s) and sulfur atom(s) among the respective atoms constituting the aromatic rings which are to be subjected to calculation in the aromatic compound model is divided by the total number of these atoms to obtain value P, and the resulting value P is the parameter of aromatic ring charge (or when k is an integer of 1 or more, and the aromatic compound model has one or more groups (C) selected from the group consisting of hydrocarbyloxy group which may be substituted, hydrocarbylmercapto group which may be substituted and hydrocarbylamino group which may be substituted as R and bonding to the aromatic ring to be subjected to calculation, the parameter is value (Q) obtained by adding to the above value (P) a value (P') obtained by dividing the total sum of the charges of atoms bonding to the aromatic ring to be subjected to calculation in the groups (C) by the total number of these atoms and further dividing the quotient by 10). (In the aromatic compound model, the aromatic ring to be subjected to calculation in the aromatic compound model is as follows: (a) in case the aromatic ring bonding to $H_X$ is a monocyclic aromatic ring, the aromatic ring to be subjected to calculation is the monocyclic aromatic ring, (b) in case the aromatic ring bonding to $H_X$ is an aromatic condensed ring formed by condensation of a plurality of monocyclic aromatic rings, the aromatic ring to be subjected to calculation is the aromatic condensed ring or (c) in case the aromatic ring bonding to $H_X$ is a ring formed by condensation of one or more ring(s) (A) selected from the group consisting of aromatic condensed ring(s) and monocyclic aromatic ring(s) and one or more ring(s) (B) selected from ring(s) other than the ring(s) (A), the aromatic ring to be subjected to calculation is the ring bonding to $H_X$ among ring(s) (A)).

First, the method for obtaining the value of parameter of the aromatic ring of the aromatic compound represented by the following formula (Va) will be explained.

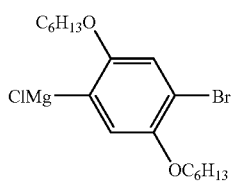

(Va)

Firstly, an aromatic compound model of the following formula (VIa) obtained by replacing Br and MgCl of the aromatic compound of the above formula (Va) are replaced with hydrogen atom is subjected to optimization of structure by the AMI semiempirical molecular orbital calculation method by WinMOPAC3.9 of Fujitsu, Ltd., and then charges of atoms constituting the aromatic compound model are calculated.

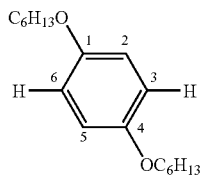

(VIa)

In the above formula (VIa), the aromatic ring bonding to $H_X$ in the formula (VI) (hydrogen atom on the right side in the formula (VIa)) is a benzene ring which is a monocyclic aromatic ring, and hence the aromatic ring to be subjected to calculation is benzene ring.

The sum total of charges of carbon atoms constituting this ring (atoms having the numbers of 1-6 in the formula (VIa)) is −0.494, and the value (P) obtained by dividing −0.494 by the total number of these atoms (6 in the case of the formula (VIa)) is −0.082.

In this case, however, as to the aromatic compound model of the formula (VIa), k is 2 in the formula (VI), and the aromatic compound model has two groups (C) (methoxy groups corresponding to hydrocarbyloxy groups) bonding to the benzene ring which is the aromatic ring to be subjected to calculation.

Therefore, the parameter of aromatic ring charge of the aromatic compound represented by the formula (Va) is calculated to be value (Q) of −0.104 which is obtained by adding to the above value (P) of −0.082 a value (P') of −0.022 obtained by dividing the sum total of −0.430 of charges of oxygen atoms bonding to the aromatic ring to be subjected to calculation in the group (C) by the total number of these atoms (2 in the case of the formula (VIa)) and further dividing the quotient by 10.

Next, the method for obtaining the value of the parameter of aromatic ring of the aromatic compound represented by the following formula (Vb) will be explained.

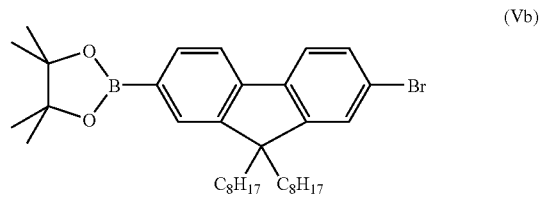

(Vb)

Charges of atoms constituting the aromatic compound model of the following formula (VIb) corresponding to the aromatic compound represented by the above formula (Vb) are calculated in the same manner as above.

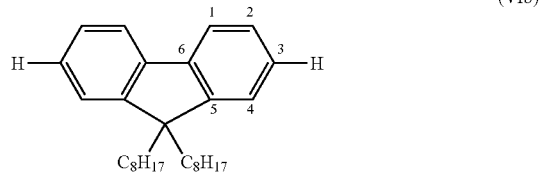

(VIb)

In the above formula (VIb), the aromatic ring bonding to $H_X$ is a ring formed by condensation of two benzene rings which are monocyclic aromatic rings (corresponding to ring (A) in the definition of aromatic ring to be subjected to calculation) and one cyclopentane ring (corresponding to ring (B) in the definition of aromatic ring to be subjected to calculation), and hence the aromatic ring to be subjected to calculation is benzene ring.

The sum total of charges of carbon atoms constituting the ring (atoms having the numbers of 1-6 in the formula (VIb)) is −0.586, and the value (P) of −0.098 obtained by dividing −0.586 by the total number of the atoms (6 in the case of the formula (VIb)) is the parameter of aromatic ring charge of the aromatic compound represented by the formula (Vb).

Next, the method for obtaining the value of parameter of aromatic ring of the aromatic compound represented by the following formula (Vc) will be explained.

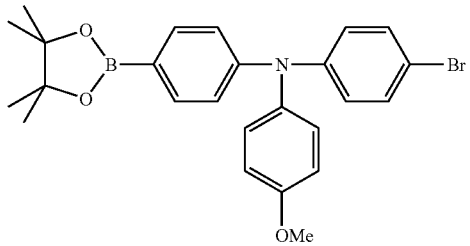
(Vc)

Charges of atoms constituting the aromatic compound model of the following formula (VIc) corresponding to the aromatic compound represented by the above formula (Vc) are calculated in the same manner as above.

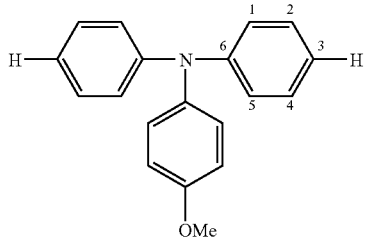
(VIc)

In the above formula (VIc), the aromatic ring bonding to $H_X$ is a benzene ring which is a monocyclic aromatic ring, and hence the aromatic ring to be subjected to calculation is benzene ring.

The sum total of charges of carbon atoms constituting this ring (atoms having the numbers of 1-6 in the formula (VIc)) is −0.622, and the value (P) of −0.104 obtained by dividing −0.622 by the total number of the atoms (6 in the case of the formula (VIc)) is the parameter of aromatic ring charge of the aromatic compound represented by the formula (Vc).

Next, the method for obtaining the value of the parameter of aromatic ring of the aromatic compound represented by the following formula (Vd) will be explained.

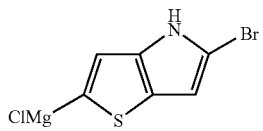
(Vd)

Charges of atoms constituting the aromatic compound model of the following formula (VId) corresponding to the aromatic compound represented by the above formula (Vd) are calculated in the same manner as above.

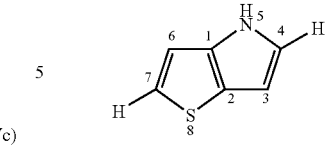
(VId)

In the above formula (VId), the aromatic ring bonding to $H_X$ is an aromatic condensed ring formed by condensation of two pyrrole rings which are monocyclic aromatic rings, and hence the aromatic ring to be subjected to calculation is the aromatic condensed ring.

The sum total of charges of carbon atoms, nitrogen atom and sulfur atom constituting this ring (atoms having the numbers of 1-8 in the formula (VId)) is −0.888, and the value (P) of −0.111 obtained by dividing −0.888 by the total number of the atoms (8 in the case of the formula (VId)) is the parameter of aromatic ring charge of the aromatic compound represented by the formula (Vd).

Next, the method for obtaining the value of the parameter of aromatic ring of the aromatic compound represented by the following formula (Ve) will be explained.

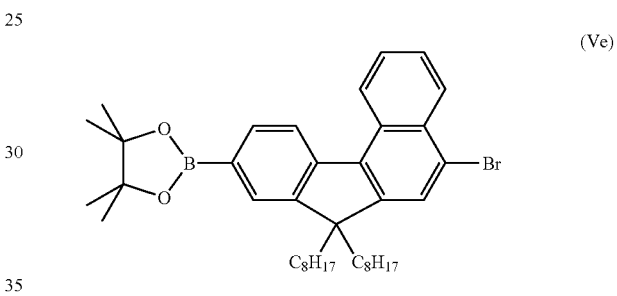
(Ve)

Charges of atoms constituting the aromatic compound model of the following formula (VIe) corresponding to the aromatic compound represented by the above formula (Ve) are calculated in the same manner as above.

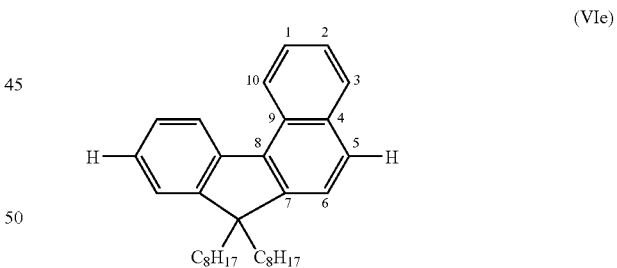
(VIe)

In the above formula (VIe), the aromatic ring bonding to $H_X$ is a ring formed by condensation of benzene ring (corresponding to ring (A) in the definition of aromatic ring to be subjected to calculation) which is a monocyclic aromatic ring, naphthalene ring (corresponding to ring (A) in the definition of aromatic ring to be subjected to calculation) which is an aromatic condensed ring, and cyclopentane ring (corresponding to ring (B) in the definition of aromatic ring to be subjected to calculation).

Therefore, as mentioned in the definition of aromatic ring to be subjected to calculation, the aromatic ring to be subjected to calculation is the naphthalene ring bonding to $H_X$ among the benzene ring and naphthalene ring which correspond to ring (A).

The sum total of charges of carbon atoms constituting this ring (atoms having the numbers of 1-10 in the formula (VIe)) is −0.856, and the value (P) of −0.086 obtained by dividing −0.856 by the total number of the atoms (10 in the case of the formula (VIe)) is the parameter of aromatic ring charge of the aromatic compound represented by the formula (Ve).

Next, the method for obtaining the value of the parameter of aromatic ring of the aromatic compound represented by the following formula (Vf) will be explained.

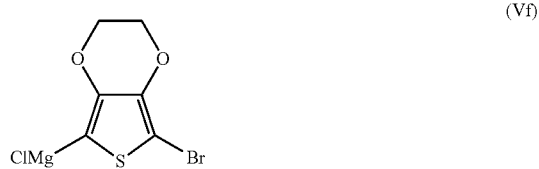

(Vf)

Charges of atoms constituting the aromatic compound model of the following formula (VIf) corresponding to the aromatic compound represented by the above formula (Vf) are calculated in the same manner as above.

(VIf)

In the above formula (VIf), the aromatic ring bonding to $H_X$ is thiophene ring which is a monocyclic aromatic ring, and hence the aromatic ring to be subjected to calculation is the thiophene ring.

The sum total of charges of carbon atoms and sulfur atom constituting this ring (atoms having the numbers of 1-5 in the formula (VIf)) is −0.338, and the value (P) obtained by dividing −0.338 by the total number of the atoms (5 in the case of the formula (VIf)) is −0.068.

In this case, however, as for the aromatic compound model of the formula (VIf), k is 2 in the formula (VI), and the aromatic compound model has two groups (C) (in which two hydrocarbyloxy groups form a ring together) bonding to the aromatic ring to be subjected to calculation.

Therefore, the parameter of aromatic ring charge of the aromatic compound represented by the formula (Vf) is calculated to be value (Q) of −0.086 which is obtained by adding to the above value (P) of −0.068 a value (P') of −0.018 obtained by dividing the sum total of −0.354 of charges of oxygen atoms bonding to the aromatic ring to be subjected to calculation in the group (C) by the total number of these atoms (2 in the case of the formula (VIf)) and further dividing the quotient by 10.

Specific examples of the parameters of aromatic ring charges are shown in Table 1

TABLE 1

| Aromatic compound models represented by the formula (VI) | Parameters of aromatic ring charges |
|---|---|
| 2,5-Dihexyloxybenzene | −0.104 |
| 3-((2-(2-methoxyethoxy)ethoxy)methyl)thiophene | −0.113 |

TABLE 1-continued

| Aromatic compound models represented by the formula (VI) | Parameters of aromatic ring charges |
|---|---|
| 3-Hexylthiophene | −0.116 |
| 3-Dodecylthiophene | −0.116 |
| Thiophene | −0.129 |
| 1-Hexylpyrrole | −0.163 |
| 9,9-Dioctylfluorene | −0.098 |
| 4-Methoxytriphenylamine | −0.104 |
| Thieno[3,2-b]pyrrole | −0.111 |
| 7,7-Dioctyl-7H-benzo[c]fluorine | −0.086 |
| Ethylenedioxythiophene | −0.086 |

In the production method of the present invention, two or more aromatic compounds which are selected from aromatic compounds represented by the general formula (V) and are different in the group Ar are sequentially contacted in descending order of parameters of aromatic ring charges. The difference between these parameters of aromatic ring charges is preferably 0.001 or more, more preferably 0.003 or more, and further preferably 0.005 or more.

As the aromatic compounds represented by the general formula (V) used in the production method of the present invention, preferably two to eight, more preferably two to four, further preferably two to three kinds of these aromatic compounds are used. When three or more of the aromatic compounds represented by the general formula (V) are used, they may contain at least two of the aromatic compounds different in Ar.

In the production method of the present invention, there are no limitation in the amount of the nickel complex containing the phosphine compound represented by the formula (I) or the palladium complex containing the phosphine compound represented by the formula (II), and it is preferably from 0.0001 to 30 mol %, more preferably from 0.01 to 20 mol %, and further preferably from 0.1 to 10 mol % as the amount of metal based on the total amount of the aromatic compound represented by the general formula (V) in the case of the total number of mols of the aromatic compounds being assumed to be 100 mol %.

In the production method of the present invention, when a nickel complex containing the phosphine compound represented by the formula (I) is used, (A) the aromatic compound represented by the general formula (V) is preferably one in which M is —$Z^1(Z^2)_m$, and (B) when a palladium complex containing the phosphine compound represented by the formula (II) is used, the aromatic compound represented by the general formula (V) is preferably one in which M is —$B(OQ^1)_2$. Reaction conditions will be explained below as examples of reaction conditions of the copolymerization (A) and the copolymerization (B).

Copolymerization Condition (A)

In the copolymerization (A), the aromatic compound represented by the general formula (V) is more preferably an aromatic magnesium compound represented by the following general formula (VII).

(VII)

(wherein Ar, R and k are as defined hereinabove, $X^a$ represents a halogen atom, a nitro group or a group represented by —SO₃Q (where Q represents a hydrocarbyl group which may be substituted), and $Z^a$ represents a halide ion).

In the above general formula (VII), the halide ion represented by $Z^a$ is preferably chloride ion, bromide ion or iodide ion, more preferably bromide ion or iodide ion, and further preferably bromide ion. Specific examples and preferred examples of Ar, R and k are the same as given hereinabove, and specific examples and preferred examples of $X^a$ are the same as those of X mentioned above.

It is preferred to obtain the aromatic magnesium compound represented by the general formula (VII) by reacting a dihalogenated aromatic compound represented by the following general formula (VIII) with an organomagnesium reagent.

(VIII)

(wherein Ar, R, k and $X^a$ are the same as defined above, and $X^b$ represents a halogen atom).

In the above formula (VIII), $X^b$ is a halogen atom, and is preferably chlorine atom, bromine atom or iodine atom, more preferably bromine atom or iodine atom, and further preferably bromine atom. Specific examples and preferred examples of Ar, R, k and $X^a$ are the same as given hereinabove.

The organomagnesium reagents is, for example, a compound represented by the formula: R'MgX' (where R' represents an alkyl group of 1-8 carbon atoms, a vinyl group of 2-8 carbon atoms or a phenyl group, and X' represents a chlorine atom, a bromine atom or an iodine group). These alkyl group, vinyl group and phenyl group may be substituted. Especially preferred organomagnesium reagent is isopropylmagnesium chloride.

The amount of the organomagnesium reagent is usually from 0.5 mol to 10 mols, preferably from 0.9 mol to 1.1 mol, more preferably from 0.95 mol to 1.05 mol for 1 mol of the dihalogenated aromatic compound represented by the general formula (VIII).

Usually, a solvent is used for the reaction of the dihalogenated aromatic compound represented by the general formula (VIII) with the organomagnesium reagent. Examples of the solvent are aromatic hydrocarbons such as benzene, toluene and xylene; chain or cyclic aliphatic hydrocarbons such as heptane and cyclohexane; halogenated hydrocarbons such as chlorobenzene, dichlorobenzene and dichloromethane; nitriles such as acetonitrile and benzonitrile; ethers such as dioxane, tetrahydrofuran and ethylene glycol dimethyl ether; amides such as N,N-dimethylformamide and N-methylpyrrolidone; and nitro compounds such as nitromethane and nitrobenzene. Aromatic hydrocarbons and ethers are preferred. These solvents may be used each alone or in combination of two or more.

The amount of the solvent is usually from 0.01 mL to 10,000 mL, preferably from 0.1 mL to 1,000 ml, more preferably from 1 mL to 100 mL for 1 g of the dihalogenated aromatic compound represented by the general formula (VIII).

The temperature used in the reaction of the dihalogenated aromatic compound represented by the general formula (VIII) with the organomagnesium reagent is usually from −60° C. to +160° C., preferably from −40° C. to +120° C., more preferably from −20° C. to +80° C. The reaction time is usually from 1 minute to 200 hours, preferably from 5 minutes to 96 hours, more preferably from 10 minutes to 48 hours.

As the reaction conditions of copolymerization (A), there may be used reaction conditions of various aromatic couplings which uses a nickel catalyst and are disclosed in Chem. Rev. 102, 1359 (2002) and reference literatures mentioned therein. A representative example of the reaction conditions of copolymerization (A) will be explained below.

The copolymerization (A) may be carried out in the presence of a halogenated alkali salt (namely, in the coexistence of the above nickel complex and a halogenated alkali salt). The halogenated alkali salts are preferably lithium chloride, sodium chloride, potassium chloride, lithium bromide, sodium bromide and potassium bromide, more preferably lithium chloride and lithium bromide, especially preferably lithium chloride. The amount of the halogenated alkali salt added is usually from 0.01 mol to 100 mols, preferably from 0.1 mol to 50 mols, more preferably from 0.5 mol to 10 mols for 1 mol of the aromatic compound represented by the general formula (V).

Usually a solvent is used in the above copolymerization (A). Examples of the solvent are aromatic hydrocarbons such as benzene, toluene and xylene; chain or cyclic aliphatic hydrocarbons such as heptane and cyclohexane; halogenated hydrocarbons such as chlorobenzene, dichlorobenzene and dichloromethane; nitriles such as acetonitrile and benzonitrile; ethers such as dioxane, tetrahydrofuran and ethylene glycol dimethyl ether; amides such as N,N-dimethylformamide and N-methylpyrrolidone; and nitro compounds such as nitromethane and nitrobenzene. Aromatic hydrocarbons and ethers are preferred. These solvents may be used each alone or in combination of two or more. When the aromatic magnesium compound is produced using dihalogenated aromatic compound and organomagnesium reagent, the solvent used for the reaction and the solvent used for the above mentioned polycondensation may be the same or different.

The amount of the solvent is usually from 0.01 mL to 10,000 mL, preferably from 0.1 mL to 1,000 mL, more preferably from 1 mL to 1 to 100 mL for 1 g of the aromatic compound represented by the general formula (V).

The reaction temperature in the copolymerization (A) is usually from −60° C. to +100° C., preferably from −50° C. to +60° C., more preferably from −40° C. to +40° C. The reaction time is usually from 10 minutes to 1,000 hours, preferably from 30 minutes to 500 hours, more preferably from 1 hour to 200 hours.

After completion of the reaction of the copolymerization (A), the resulting polymerization mixture is preferably isolated, if necessary, by washing it with aqueous hydrochloric acid solution or water, and then evaporating the organic solvent or by adding a poor solvent to precipitate an aromatic polymer.

Copolymerization Conditions (B)

As the reaction conditions of copolymerization (B), there may be used reaction conditions of various aromatic couplings using a palladium catalyst which are disclosed in Chem. Rev. 102, 1359 (2002) and reference literatures mentioned therein. Particularly, a reaction which uses an aromatic compound of the general formula (V) where X is a halogen atom and M is —B(OQ¹)₂ is a representative reaction called Suzuki's coupling disclosed in Chem. Rev. 95, 2457 (1995), J. Am. Chem. Soc. 129, 7236 (2007) and reference literatures mentioned therein. A representative example of the reaction conditions of copolymerization (B) will be explained below.

It is preferred to use a base in the copolymerization (B), and specific examples of the base are hydroxide salts, carbonic acid salts, phosphoric acid salts, and fluoride salts containing lithium ion, sodium ion, potassium ion, cesium ion or tetraalkylammonium ion as a counter cation. Preferred are sodium hydroxide, potassium hydroxide, sodium carbonate, potassium carbonate, cesium carbonate and cesium fluoride.

The amount of the base used is not limited, and is preferably from 0.01 mol to 1000 mols, more preferably from 0.1 mol to 100 mols, further preferably from 1 mol to 100 mols based on 1 mol of the aromatic compound represented by the general formula (V).

The copolymerization (B) is preferably carried out in a reaction solvent. Examples of the reaction solvent are aromatic hydrocarbons such as benzene, toluene and xylene; chain or cyclic aliphatic hydrocarbons such as heptane and cyclohexane; halogenated hydrocarbons such as chlorobenzene, dichlorobenzene and dichloromethane; nitriles such as acetonitrile and benzonitrile; alcohols such as methanol, ethanol, n-propyl alcohol and iso-propyl alcohol; ethers such as dioxane, tetrahydrofuran and ethylene glycol dimethyl ether; amides such as N,N-dimethylformamide and N-methylpyrrolidone; and nitro compounds such as nitromethane and nitrobenzene; and water. The reaction solvents are preferably aromatic hydrocarbons, halogenated hydrocarbons, nitriles, ethers, nitro compounds or water. These reaction solvents may be used each alone or in admixture of two or more.

The amount of the solvent is usually from 0.01 ml to 10,000 mL, preferably from 0.1 mL to 1,000 mL, more preferably from 1 mL to 500 mL for 1 g of the total amount of the aromatic compounds represented by the general formula (V).

The reaction temperature in the copolymerization (B) is usually from −100° C. to +200° C., preferably from −50° C. to +150° C., more preferably from −20° C. to +100° C. The reaction time is usually from 0.1 minute to 1,000 hours, preferably from 1 minute to 500 hours, more preferably from 10 minutes to 200 hours.

As for the after-treatment carried out in the copolymerization (B), in case an aqueous layer separates after completion of the reaction, this is separated and, if necessary, the resulting oil layer is washed with an aqueous hydrochloric acid solution or water, followed by evaporation of the organic solvent or adding a poor solvent to produce a precipitate, which is then filtered, washed and dried, thereby isolating an aromatic polymer.

<Block Copolymer>

The block copolymer of the present invention is the block copolymer produced by the above mentioned method of the present invention.

The number-average molecular weight of the block copolymer in terms of polystyrene is preferably 6,000 or more, more preferably 8,000 or more, further preferably 10,000 or more. The molecular weight distribution of the block copolymer specified by (weight-average molecular weight in terms of polystyrene)/(number-average molecular weight in terms of polystyrene) is preferably from 1.0 to 1.8, more preferably from 1.0 to 1.6, and further preferably from 1.0 to 1.4.

The block copolymer has a structure comprising two or more blocks represented by the following general formula (VII) which are linked to each other.

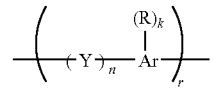

(wherein Ar, R, k and Y are the same as defined hereinabove, and r is a number of 2 or more).

For example, when a compound (X) of the formula (V) in which Ar is A and k and n are 0 is reacted in the presence of a catalyst, and then a compound (XI) of the formula (V) in which Ar is B and k and n are 0 and having a value of parameter of aromatic ring smaller than that of the compound (X) is reacted, a block copolymer represented by the following formula is obtained.

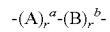

(where $r^a$ and $r^b$ are numbers of 2 or more).

Since the block copolymer of the present invention can contain two or more monomers differing in basic structure, different functionalities such as electron transportation/hole transportation, hydrophilic property/hydrophobic property, ionic property/non-ionic property, etc. can be imparted to the block copolymer of the present invention. Furthermore, the block copolymer of the present invention has not only a narrow molecular weight distribution as the copolymer, but also a narrow chain length distribution of the respective copolymer components, and therefore the block copolymer can be expected to have characteristics of being highly self-integrated or of forming precision layer structure. Therefore, it has excellent characteristics, for example, electric characteristics, optical characteristics, heat resistance, mechanical characteristics, etc., and thus it is particularly useful for advanced functional materials such as conductive materials, photoelectric transfer materials, luminescent materials, non-linear optical materials, battery materials, electronic part materials and automobile materials.

EXAMPLES

The present invention will be explained in more detail by the following examples, which should not be construed as limiting the invention in any manner.

The molecular weight of the polymer is a relative molecular weight on the basis of polystyrene (namely, molecular weight in terms of polystyrene) measured by gel permeation chromatography. The number-average molecular weight is shown by "Mn", and the weight-average molecular weight is shown by "Mw".

Furthermore, 1,2-bis(diphenylphosphino)ethane is abbreviated to read "dppe", and 1,3-bis(diphenylphosphino)propane is abbreviated to read "dppp". The "polymer yield" shown in Table 1 given hereinafter is a theoretical value obtained from value of monomer conversion (found value).

Reference Example 1

Parameters of aromatic ring charges corresponding to the aromatic compound model represented by the general formula (VI) were obtained to find −0.104 for 2,5-dihexyloxybenzene, −0.113 for 3-((2-(2-methoxyethoxy)ethoxy)methyl)thiophene, −0.116 for 3-hexylthiophene, −0.163 for 1-hexylpyrrole, −0.098 for 9,9-dioctylfluorene, and −0.104 for 4-methoxytriphenylamine.

Example 1

0.042 g (0.99 mmol) of anhydrous lithium chloride was put in a flask, and vacuum dried with heating the flask using a heat gun, and the flask was subjected to argon substitution, followed by returning the temperature to room temperature. 0.483 g (1.00 mmol) of 1-bromo-2,5-dihexyloxy-4-iodobenzene and 0.0317 g (0.240 mmol) of naphthalene as an internal standard material were added, and the flask was again subjected to argon substitution. 5 mL of dried THF was added thereto, and 0.5 mL (1.0 mmol) of a solution of isopropylmagnesium chloride in THF (2.0 mol/l) was added, followed by stirring for 1 hour at 0° C. to Grignardize the 1-bromo-2,5-dihexyloxy-4-iodobenzene. Thereafter, 0.0100 g (0.0189 mmol, 1.9 mol %) of Ni(dppe)Cl$_2$ suspended in 5 mL of THF was added, followed by stirring at room temperature for 30 minutes. In another egg-plant type flask were put 0.421 g (1.00 mmol) of 2,5-dibromo-3-((2-(2-methoxyethoxy)ethoxy)methyl)thiophene, 0.0279 g (0.218 mmol) of naphthalene, 5 mL of dried THF and 0.5 mL (1.0 mmol) of a solution of isopropylmagnesium chloride in THF (2.0 mol/l), and they were stirred at 0° C. for 1 hour to Grignardize 2,5-dibromo-3-((2-(2-methoxyethoxy)ethoxy)methyl)thiophene. A THF solution thereof was added to the reaction mixture, followed by stirring at room temperature for 10 minutes. After completion of the reaction, 5M HCl was added, then the reaction product was subjected to extraction with chloroform, and the organic layer was washed with water and then dried with anhydrous magnesium sulfate. The solvent was distilled off under reduced pressure to obtain a block copolymer (Mn=17600, Mw/Mn=1.21) represented by the following formula.

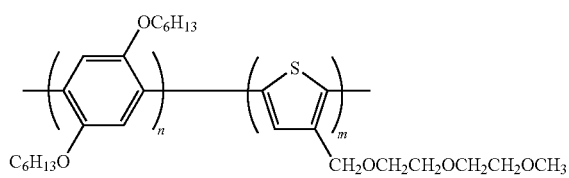

Comparative Example 1

A flask was vacuum dried while heating by a heat gun and then subjected to argon substitution, and, thereafter, the temperature was returned to room temperature. Therein were put 0.421 g (1.00 mmol) of 2,5-dibromo-3-((2-(2-methoxyethoxy)ethoxy)methyl)thiophene and 0.0527 g (0.411 mmol) of naphthalene as an internal standard material, followed by again subjecting to argon substitution. 5 mL of dried THF was added thereto, and 0.5 mL (1.0 mmol) of a solution of isopropylmagnesium chloride in THF (2.0 mol/l) was added, followed by stirring for 1 hour at 0° C. to Grignardize the 2,5-dibromo-3-((2-(2-methoxyethoxy)ethoxy)methyl)thiophene. Thereafter, 0.0095 g (0.0180 mmol, 1.8 mol %) of Ni(dppe)Cl$_2$ suspended in 5 mL of THF was added, followed by stirring at room temperature for 1.5 hour. In another egg-plant type flask were put 0.483 g (1.00 mmol) of 1-bromo-2,5-dihexyloxy-4-iodobenzene, 0.0387 g (0.302 mmol) of naphthalene, 5 mL of dried THF and 0.5 mL (1.0 mmol) of a solution of isopropylmagnesium chloride in THF (2.0 mol/l), and they were stirred at 0° C. for 1 hour to Grignardize the 1-bromo-2,5-dihexyloxy-4-iodobenzene. A THF solution thereof was added to the reaction mixture, followed by stirring at room temperature for 24 hours. After completion of the reaction, 5M HCl was added, followed by extraction with chloroform, washing the organic layer and then drying with anhydrous magnesium sulfate. The solvent was distilled off under reduced pressure to obtain a block copolymer (Mn=3100, Mw/Mn=4.20).

As can be seen from Example 1 and Comparative Example 1, when the Grignardized 2,5-dihexyloxy-4-iodobenzene greater in parameter of aromatic ring charge (−0.104) was first polymerized and thereafter 2,5-dibromo-3-((2-(2-methoxyethoxy)ethoxy)methyl)thiophene (−0.113) was copolymerized, a block copolymer having a narrow molecular weight distribution was obtained.

Example 2

0.042 g (0.99 mmol) of anhydrous lithium chloride was put in a flask, and vacuum dried with heating the flask using a heat gun, followed by carrying out argon substitution and returning the temperature to room temperature. Thereto were added 0.483 g (1.00 mmol) of 1-bromo-2,5-dihexyloxy-4-iodobenzene and 0.0448 g (0.350 mmol) of naphthalene as an internal standard material, and the flask was again subjected to argon substitution. 5 mL of dried THF was added thereto, and 0.5 mL (1.0 mmol) of a solution of isopropylmagnesium chloride in THF (2.0 mol/l) was added, followed by stirring for 1 hour at 0° C. to Grignardize the 1-bromo-2,5-dihexyloxy-4-iodobenzene. Thereafter, 0.0105 g (0.0199 mmol, 2.0 mol %) of Ni(dppe)Cl$_2$ suspended in 5 mL of THF was added, followed by stirring at room temperature for 30 minutes. In another egg-plant type flask were put 0.373 g (1.00 mmol) of 2,5-dibromo-3-hexylthiophene, 0.0329 g (0.257 mmol) of naphthalene, 5 mL of dried THF and 0.5 mL (1.0 mmol) of a solution of isopropylmagnesium chloride in THF (2.0 mol/l), and they were stirred at 0° C. for 1 hour to Grignardize 2,5-dibromo-3-hexylthiophene. A THF solution thereof was added to the reaction mixture, followed by stirring at room temperature for 10 minutes. After completion of the reaction, 5M HCl was added, followed by extraction with chloroform, and the organic layer was washed with water and then dried with anhydrous magnesium sulfate. The solvent was distilled off under reduced pressure to obtain a block copolymer (Mn=16200, Mw/Mn=1.27) represented by the following formula. A block copolymer having a narrow molecular weight distribution was obtained by first polymerizing the Grignardized 2,5-dihexyloxy-4-iodobenzene greater in parameter of aromatic ring charge (−0.104), and then copolymerizing 2,5-dibromo-3-hexylthiophene (−0.116).

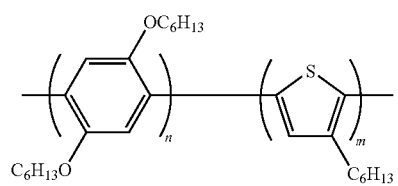

Example 3

0.044 g (1.04 mol) of anhydrous lithium chloride was put in a flask, and vacuum dried with heating the flask using a heat gun, followed by carrying out argon substitution and returning the temperature to room temperature. Thereto were added 0.487 g (1.01 mmol) of 1-bromo-2,5-dihexyloxy-4-iodobenzene and 0.0437 g (0.341 mmol) of naphthalene as an internal standard material, and the flask was again subjected to argon substitution. 5 mL of dried THF was added thereto, and 0.48 mL (0.96 mmol) of a solution of isopropylmagnesium chloride in THF (2.0 mol/l) was added, followed by stirring for 1 hour at room temperature to Grignardize the 1-bromo-2,5-dihexyloxy-4-iodobenzene. Thereafter, 0.0137 g (0.026 mmol, 2.6 mol %) of Ni(dppe)Cl$_2$ suspended in 5 mL of THF was added, followed by stirring at room temperature for 30 minutes. In another egg-plant type flask were put 0.319 g (1.03 mmol) of N-hexyl-2,5-dibromopyrrole, 0.0122 g (0.0306 mmol, 3.1 mol %) of dppe, 0.0417 g (0.325 mmol) of naphthalene, 5 mL of dried THF and 0.48 mL (0.96 mmol) of a solution of isopropylmagnesium chloride in THF (2.0 mol/l), and the they were stirred at room temperature for 24 hours to Grignardize the N-hexyl-2,5-dibromopyrrole. A THF solution thereof was added to the reaction mixture, followed by stirring at 0° C. for 9 hours. After completion of the reaction, 5M HCl was added, followed by extraction with chloroform, and the organic layer was washed with saturated aqueous sodium bicarbonate solution and water, and then dried with anhydrous sodium sulfate. The solvent was distilled off under reduced pressure to obtain 0.448 g of a block copolymer (Mn=17000, Mw/Mn=1.23) represented by the following formula. A block copolymer having a narrow molecular weight distribution was obtained by first polymerizing the Grignardized 1-bromo-2,5-dihexyloxy-4-iodobenzene greater in parameter of aromatic ring charge (−0.104), and then copolymerizing N-hexyl-2,5-dibromopyrrole (−0.163).

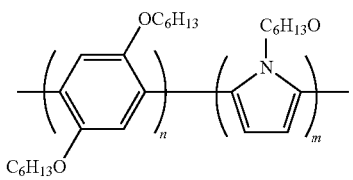

Example 4

(i) Pinacol 2-bromo-9,9-dioctylfluorene-7-boronate was prepared in accordance with known process (Reference Document: J. Am. Chem. Soc. 126, 7041 (2004)).

(ii) (4-Bromo-phenyl)-(4-methoxy-phenyl)-[4-(4,4,5,5-tetramethyl-[1,3,2]dioxaborolan-2-yl)-phenyl]-amine was prepared in accordance with known process (Patent Document: JP-A-2007-211237.

(iii) P($^t$Bu)$_3$Pd(Ph)Br was prepared by reacting bis(tri-t-butylphosphine)palladium(0) with bromobenzene in an argon atmosphere in accordance with known process (Reference Document: J. Am. Chem. Soc. 126, 1184 (2004)).

(iv) 149 mg (0.25 mmol) of pinacol 2-bromo-9,9-dioctylfluorene-7-boronate and octylbenzene (internal standard material, 100 µL) were put in a flask in an argon atmosphere, and the flask was subjected to argon substitution. 38 mL of dried THF was added thereto to dissolve them, and then 5 mL of 2M Na$_2$CO$_3$aq. was charged. Separately, a yellow solution obtained by dissolving 5.83 mg (0.013 mmol, 5.0 mol %) of P$^t$Eu$_3$Pd(Ph)Br in 2 mL of tetrahydrofuran was charged collectively in the above monomer solution in an argon atmosphere by an argon glove box, followed by stirring at room temperature for 30 minutes. Then, thereto was added 30 mg (0.063 mmol) of (4-bromo-phenyl)-(4-methoxy-phenyl)-[4-(4,4,5,5-tetramethyl-[1,3,2]dioxaborolan-2-yl)-phenyl]-amine dissolved in 2 mL of dehydrated THF, followed by stirring at room temperature for 30 minutes. After completion of the reaction, aqueous layer was separated at room temperature. Thereafter, 10 mL of 2N hydrochloric acid was added to oil layer, and the mixture was stirred and poured in methanol, followed by stirring, and the resulting precipitate was filtered and vacuum dried to obtain a block copolymer (Mn=14600, Mw/Mn=1.34) represented by the following formula. A block copolymer having a narrow molecular weight distribution was obtained by first polymerizing pinacol 2-bromo-9,9-dioctylfluorene-7-boronate greater in parameter of aromatic ring charge (−0.098), and then copolymerizing (4-bromo-phenyl)-(4-methoxy-phenyl)-[4-(4,4,5,5-tetramethyl-[1,3,2]dioxaborolan-2-yl)-phenyl]-amine (−0.104).

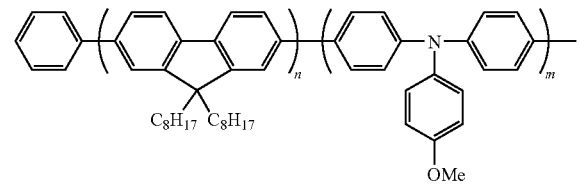

Example 5

23 mg (0.042 mmol) of pinacol 2-bromo-9,9-dioctylfluorene-7-boronate, naphthalene (internal standard material, 5.5 mg), 0.070 g (0.460 mmol) of CsF, 0.294 g (1.10 mmol) of 18-Crown-6, 4 mL of dried THF and about 0.6 mL of water were put in a flask in an argon atmosphere, followed by deaeration and argon substitution. Separately, 1.0 mg (0.0021 mmol, 5.0 mol %) of P$^t$Bu$_3$Pd(Ph)Br and 2 mL of dried THF were put in an egg-plant type flask in an argon atmosphere, and the flask was deaerated using a diaphragm pump, and then subjected to argon substitution. This solution was added to the above monomer solution using a cannula, followed by stirring at 0° C. for 4 hours. Thereafter, separately, 19 mg (0.043 mmol) of 4-iodo-2,5-dihexyloxybenzene boronate and 3 mL of dried THF were put in an egg-plant type flask in an argon atmosphere, and the flask was deaerated using a diaphragm pump, and then subjected to argon substitution. This solution was added to the reaction solution using a cannula, followed by stirring at 0° C. for 1 hour. After completion of the reaction, 12N hydrochloric acid was added, and extraction was carried out with methylene chloride. The organic layer was washed with water and dried with anhydrous magnesium sulfate. The anhydrous magnesium sulfate was filtered off, and then the filtrate was vacuum dried to obtain a block copolymer (Mn=13000, Mw/Mn=1.29) represented by the following formula. A block copolymer having a narrow molecular weight distribution was obtained by first polymerizing pinacol 2-bromo-9,9-dioctylfluorene-7-boronate greater in parameter of aromatic ring charge (−0.098), and then copolymerizing 4-iodo-2,5-dihexyloxybenzeneboronic acid (−0.104).

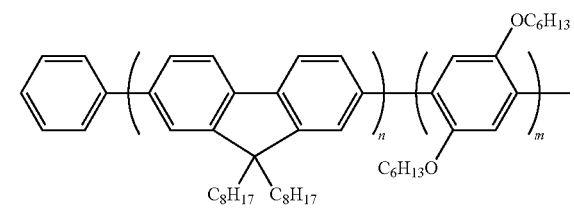

The invention claimed is:

1. A method for producing a block copolymer which comprises the step of sequentially reacting two or more aromatic compounds which are selected from aromatic compounds represented by the following general formula (V) and are different in the group Ar, in the presence of a nickel complex containing a phosphine compound represented by the following general formula (I) or a palladium complex containing a phosphine compound represented by the following general formula (II) to thereby form blocks derived from the respective aromatic compounds sequentially, wherein the two or more aromatic compounds are reacted in descending order of parameter of aromatic ring charge, the general formula (V):

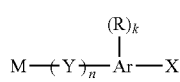
(V)

(wherein Ar represents an organic group having a valence of (2+k) and containing aromatic ring(s), X bonds to the aromatic ring in Ar, R represents a hydrocarbyl group which may be substituted, a hydrocarbyloxy group which may be substituted, a hydrocarbylmercapto group which may be substituted, a hydrocarbylcarbonyl group which may be substituted, a hydrocarbyloxycarbonyl which may be substituted, a hydrocarbylsulfonyl group which may be substituted, a hydrocarbylamino group which may be substituted or a hydrocarbylaminocarbonyl group which may be substituted, k is an integer of 0 or more, in the case of a plurality of R being present, all R may be the same or different, and two Rs may form a ring together, X represents a halogen atom, a nitro group or a group represented by $-SO_3Q$ (wherein Q represents a hydrocarbyl group which may be substituted), Y represents an oxygen atom, a sulfur atom, an imino group, a substituted imino group, an ethenylene group, a substituted ethenylene group or an ethynylene group, n is 0 or 1, M represents a hydrogen atom, $-B(OQ^1)_2$, $-Si(Q^2)_3$, $-Sn(Q^3)_3$ or $-Z^1(Z^2)_m$ (wherein $Q^1$ represents a hydrogen atom or hydrocarbyl group, two $Q^1$s may be the same or different and two $Q^1$s may form a ring together, $Q^2$ represents a hydrocarbyl group and three $Q^2$s may be the same or different, $Q^3$ represents a hydrocarbyl group and three $Q^3$s may be the same or different, $Z^1$ represents a metal atom or a metal ion, $Z^2$ represents a counter ion, and m is an integer of 0 or more), the general formula (I):

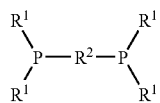
(I)

(wherein $R^1$ represents a hydrocarbyl group which may be substituted, four $R^1$s may be the same or different, and two $R^1$s may form a ring together, and $R^2$ represents a hydrocarbylene group which may be substituted), the general formula (II):

 (II)

(wherein $R^3$ is a group represented by the following formula (III) or a group represented by the following formula (IV), and three $R^3$s may be the same or different with a proviso that at least one of the three $R^3$s is a group represented by the following formula (III)),

(wherein $R^4$ represents a hydrogen atom or a hydrocarbyl group which may be substituted, three $R^4$s may be the same or different, and two $R^4$s may form a ring together, and two or more $R^4$ are not hydrogen atoms),

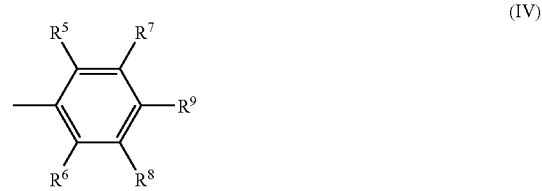

(wherein $R^5$-$R^9$ each represents independently a hydrogen atom, a halogen atom, a hydroxyl group, an amino group, a nitro group, a cyano group, a hydrocarbyl group which may be substituted, a hydrocarbyloxy group which may be substituted, a hydrocarbylmercapto group which may be substituted, a hydrocarbylcarbonyl group which may be substituted, a hydrocarbyloxycarbonyl group which may be substituted, a hydrocarbylsulfonyl group which may be substituted, a hydrocarbylamino group which may be substituted or a hydrocarbylaminocarbonyl group which may be substituted, at least one of $R^5$ and $R^6$ is not a hydrogen atom, and $R^5$ and $R^7$, $R^7$ and $R^9$, $R^6$ and $R^8$, and $R^8$ and $R^9$ may respectively form a ring together), and wherein the parameter of aromatic ring charge is value (P) or value (Q) obtained in the following manner: an aromatic compound model which corresponds to the aromatic compound of the above formula (V) and is represented by the following general formula (VI), the general formula (VI):

(VI)

(wherein the formula (VI) corresponds to the formula (V) in which M-(Y)$_n$ and X are replaced with hydrogen atom, and H$_M$ represents a hydrogen atom corresponding to M-(Y)$_n$ and H$_X$ represents a hydrogen atom corresponding to X, Ar, R and k are the same as defined above, and H$_X$ bonds to an aromatic ring in Ar) is subjected to structural optimization by the AMI method of semiempirical molecular orbital calculation, then, charges of respective atoms constituting the aromatic compound model are calculated, and the value (P) is obtained by dividing the sum total of charges of carbon atom(s), oxygen atom(s), nitrogen atom(s) and sulfur atom(s) among the respective atoms constituting the aromatic rings which are subjected to calculation in the aromatic compound model by the total number of these atoms, and when k is an integer of 1 or more and the aromatic compound model has one or more groups (C) which are bonding to the aromatic ring to be subjected to calculation and are selected from the group consisting of hydrocarbyloxy group which may be substituted, hydrocarbylmercapto group which may be substituted and hydrocarbylamino group which may be substituted as R, the value (Q) is obtained by adding to the above value (P)

a value (P') obtained by dividing the total sum of the charges of atoms bonding to the aromatic ring to be subjected to calculation in the groups (C) by the total number of these atoms and further dividing the quotient by 10; the aromatic ring to be subjected to calculation in the aromatic compound model is as follows: (a) in case the aromatic ring bonding to $H_X$ is a monocyclic aromatic ring, the aromatic ring to be subjected to calculation is the monocyclic aromatic ring, (b) in case the aromatic ring bonding to $H_X$ is an aromatic condensed ring formed by condensation of a plurality of monocyclic aromatic rings, the aromatic ring to be subjected to calculation is the aromatic condensed ring or (c) in case the aromatic ring bonding to $H_X$ is a ring formed by condensation of one or more ring(s) (A) selected from the group consisting of aromatic condensed ring(s) and monocyclic aromatic ring(s) and one or more ring(s) (B) selected from ring(s) other than the ring(s) (A), the aromatic ring to be subjected to calculation is the ring bonding to $H_X$ among ring(s) (A).

* * * * *